United States Patent
Fender et al.

(10) Patent No.: US 11,360,925 B2
(45) Date of Patent: Jun. 14, 2022

(54) METHOD AND APPARATUS FOR HOST ADAPTATION TO A CHANGE OF PERSONA OF A CONFIGURABLE INTEGRATED CIRCUIT DIE

(71) Applicant: Intel Corporation, Santa Clara, CA (US)

(72) Inventors: Joshua David Fender, Toronto (CA); Utkarsh Y. Kakaiya, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 643 days.

(21) Appl. No.: 16/232,014

(22) Filed: Dec. 25, 2018

(65) Prior Publication Data

US 2019/0146943 A1    May 16, 2019

(51) Int. Cl.
| | | |
|---|---|---|
| G06F 9/4401 | (2018.01) | |
| G06F 13/38 | (2006.01) | |
| G06F 13/40 | (2006.01) | |
| G06F 8/61 | (2018.01) | |
| G06F 9/445 | (2018.01) | |
| G06F 30/34 | (2020.01) | |

(52) U.S. Cl.
CPC ............ *G06F 13/4072* (2013.01); *G06F 8/61* (2013.01); *G06F 9/4411* (2013.01); *G06F 9/44526* (2013.01); *G06F 13/4022* (2013.01); *G06F 13/4081* (2013.01); *G06F 30/34* (2020.01)

(58) Field of Classification Search
None
See application file for complete search history.

(56) References Cited

U.S. PATENT DOCUMENTS

| | | | | |
|---|---|---|---|---|
| 8,743,653 | B1* | 6/2014 | Narayanan | G11C 7/1063 365/233.11 |
| 2006/0253619 | A1* | 11/2006 | Torudbakken | G06F 13/4022 710/31 |
| 2015/0067229 | A1* | 3/2015 | Connor | G06F 13/4022 710/317 |
| 2015/0074322 | A1* | 3/2015 | Galles | H04L 29/12367 710/313 |
| 2019/0042329 | A1* | 2/2019 | Kakaiya | G06F 9/5088 |
| 2019/0146943 | A1* | 5/2019 | Fender | G06F 13/4022 710/105 |

* cited by examiner

*Primary Examiner* — Hyun Nam

(57) ABSTRACT

A method includes receiving at a management component of an FPGA a persona change request and issuing a request by the management component to a reconfigurable PR slot of the FPGA to change a first persona of a first circuit device of the FPGA to a second persona of a second circuit device of the FPGA. The management component, the reconfigurable PR slot, and the first and second circuit devices are configured in the FPGA core. The method includes switching by the reconfigurable PR slot the first persona to the second persona. The method includes issuing a request by the management component, a host re-enumeration of the reconfigurable PR slot, triggering by the host a re-enumeration component a re-enumeration of the reconfigurable PR slot, and exposing by the reconfigurable PR slot the second persona such that the host is reconfigured to recognize the second circuit device.

20 Claims, 18 Drawing Sheets

METHOD AND APPARATUS FOR HOST ADAPTATION TO A CHANGE OF PERSONA OF A CONFIGURABLE INTEGRATED CIRCUIT DIE

FIELD OF THE DISCLOSURE

The present disclosure relates to an integrated circuit die that is housed in a multi-chip package or mounted on an interface card and connectable to an interface bus. More specifically, the present disclosure relates to a configurable integrated circuit die that may present a number of device personas to a peripheral component interconnect express bus where the bus adapts to changes of the device personas.

BACKGROUND OF THE INVENTION

Configurable integrated circuit dies may be configured to implement a number of different devices where each device has a different device persona. At different times, a configurable integrated circuit die may present the different device personas of the different devices to a connected bus. A connected bus that is not dynamically reconfigurable to communicate with the different devices may limit the types of devices that the configurable integrated circuit die may be configured to implement over the connected bus. New configurable integrated circuit dies and bus structures are needed that allow the bus structure to be dynamically reconfigured to communicate with the changing devices that the configurable integrated circuit die may present to the bus.

DETAILED DESCRIPTION OF THE INVENTION

Figure 1:
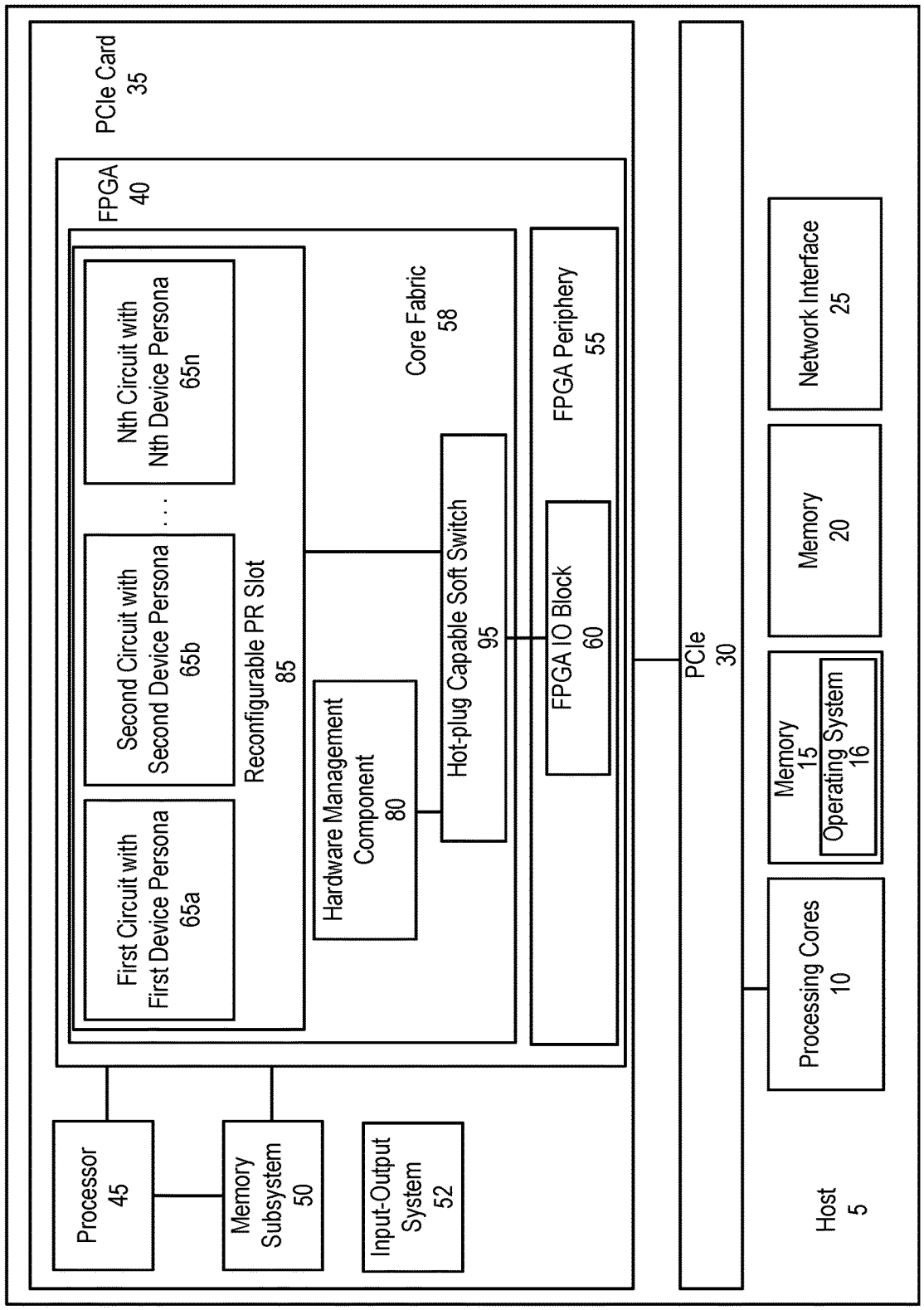
FIG. 1 illustrates a host that includes a configurable IC die, such as an FPGA, in an embodiment.

Configurable integrated circuit (IC) dies that are often packaged as system-in-package (SiP) devices continue to fuel development in IC markets. Circuit emulation markets, ASIC prototyping markets, and data center markets are a few of the developing IC markets fueled by configurable IC dies. Configurable IC dies directed toward circuit emulation markets often include a number of configurable IC dies packaged as a SiP to facilitate an almost unlimited number of emulated circuits where a single configurable IC die may be unable to supply sufficient programmable fabric for implementing a circuit emulation. Configurable IC dies directed toward ASIC prototyping markets often include a number of configurable ICs dies packaged as a SiP to implement a variety of ASICs. Configurable IC dies directed toward data center markets often include a number of configurable ICs packaged as a SiP to facilitate acceleration in the data center, to add processing capability, to add network and virtual network capability, to add non-volatile memory express capability, or other capabilities.

Configurable IC dies included in these SiP devices may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable IC dies typically include a number of configurable logic blocks that may be configured to implement various circuits. The logic blocks are interconnected by configurable interconnect structures that may be configured to interconnect the logic blocks in almost any desired configuration to provide almost any desired circuit.

A configurable IC die may be configured to implement a number of circuits where two or more of the circuits have different device personalities. For example, the programmable fabric of an FPGA device may be configured with a number of circuits that have different device personalities. The circuits may operate independently and the FPGA may dynamically change the circuit operating on the FPGA from a first circuit operating on the FPGA to a second circuit operating on the FPGA. The transition from the first circuit operating on an FPGA to the second circuit operating on the FPGA may occur under software control of the FPGA.

For example, an FPGA may be configured to operate as a non-volatile memory express (NVMe) controller, a network interface card (NIC), a data compression circuit, a data decompression circuit, a data encryption circuit, a data decryption circuit, a non-volatile memory host controller interface (NVMHCIS), or other circuits.

Each device persona of each circuit may include one for more pieces of device persona information that identifies the device persona. The device persona information may include information for a vendor identifier, a device identifier, a revision identifier, a programming interface identifier, a class code identifier, a base class code, a subsystem vendor identifier, a subsystem subclass code, identifiers for specific PCIe capabilities such as SR-IOv, address translation services (ATS), Process Address Space ID (PASID), page request interface (PRI), other identifiers, or any combination of these identifiers. The device persona may be stored in the FPGA. A change to device persona information may include addition, removal, or modification of information, such as addition, removal, or modification of specific PCIe capabilities such as SR-IOv, ATS, PASID, PRI, or other identifiers.

FIG. 1 illustrates a host 5 that includes a configurable IC die 40, such as an FPGA, in an embodiment. Host 5 may include one or more processors 10, memory 15, memory 20, a network interface controller (NIC) 25, a bus system 30, such as a PCIe bus, a PCIe card slot, and PCIe circuitry that supports the PCIe bus, and other components. The one or more processors may include a central processing unit (CPU), a microprocessor, a graphical processing unit (GPU), a digital signal processor (DSP), an application specific integrated circuit (ASIC), a vision processing unit (VPU), an image array processors (SIMD), a neural network processor, an artificial intelligence processor, a cryptographic accelerator, just to name a few.

Memory 15 may store a host operating system 16, other host system software, or both. Memories 15 and 20 may include one or more types of memories, such as RAM, FLASH, disk memory (e.g., magnetic memory, optical memory, or others), other types of memory, or any combination so these memory types.

Host 5 may be an aggregated server or a disaggregated server. An aggregated server may be in a single housing, on a single sled of a rack, on a single plug-in card (e.g., a single PCIe card), on a single motherboard, or other aggregated configuration. A disaggregated server may include distributed components, such as components that are distributed on one or more circuit boards in a housing, one or more sleds in a rack, one or more sleds in different racks, on different plug-in cards, in different data centers, or may have other distributions of components. Therefore, while FIG. 1 generally shows that host 5 is an aggregated device, the illustration of the host in FIG. 1 represents a specific embodiment.

Configurable IC die 40 may be mounted on a card 35, such as a PCIe card. The card may include one or more other components, such as a processor 45, a memory subsystem 50, an input-output (IO) system 52, other components, or any combination of these components. The card may be inserted in a card slot on one of the circuit boards of the host, such as a PCIe card slot.

In an embodiment, the configurable IC die is configured (e.g., programmed) with two or more of circuit devices, such as circuit devices 65a, 65b . . . 65n, where each circuit device has a different persona. Each circuit device may be a fully compliant PCIe device and have a unique PCIe identity. Thus, the circuit devices may access and use PCIe attributes, such as PCIe device drivers, single root input-output virtualization (SR-IOv), existing PCIe classes, other PCIe attributes, or any combination of these attributes.

If the configurable IC die is an FPGA, the circuit devices may be in the core fabric 58 of the FPGA. The FPGA may operate these circuit devices at different times.

The configurable IC die includes a hardware management component 80 and a reconfigurable partial reconfiguration (PR) slot 85. The hardware management component may be a PCIe physical function, a network interface management component, or other management components. The reconfigurable PR slot may be a PCIe physical function, a network interface management component, or another reconfigurable slot. The reconfigurable PR slot is reconfigurable by the hardware management component.

The circuit devices of the configurable IC die are assigned to the reconfigurable PR slot 85. For example, circuit device 65a may be assigned to the reconfigurable PR slot, circuit device 65b may be assigned to the reconfigurable PR slot, and circuit device 65n may be assigned to the reconfigurable PR slot. That is, each circuit device is programmed on top of the same reconfigurable PR slot. The reconfigurable PR slot is programmed or re-programmed with a device persona of one of the circuit devices when the circuit device operates on the configurable IC die.

In an embodiment where the configurable IC die is an FPGA, the hardware management component, the reconfigurable PR slot, or both may be in the core fabric of the FPGA. In one embodiment, one or more components of the hardware management component are hardened components in the FPGA periphery 55.

Configurable IC die 40 includes a static port 95. The static port is connected between the hardware management component 80 and the IO block 60 (e.g., a hardened FPGA IO block) and is connected between the reconfigurable PR slot 85 and the IO block. The static port may be a host attached PCIe physical function, a PCIe switch, a network interface endpoint, a platform management link, or another type of port. The host attached PCIe physical function may be a hot-plug capable soft switch. The static port may communicate with the host through the IO block 60. The 10 block may be in the configurable IC die periphery 55 (e.g., FPGA periphery).

In an embodiment, the physical function of the hardware management component may receive a request to switch the circuit device operating on the configurable IC die from a first circuit device to a second circuit device. For example, in an embodiment where the host is operating in a data center, the configurable IC die may be operating a first circuit device that is an encryption accelerator, and may receive a request from a client device to operate a second circuit device that is a network interface controller (NIC), a non-volatile memory express (NVMe) controller, or other circuit device.

After the hardware management component receives a request to switch the circuit device operating on the configurable IC die from a first circuit device to a second circuit device, the hardware management component issues a request to the hot-plug capable soft switch 95 to issue a re-enumeration request to the operating system, the BIOS, virtual machine manager (VMM), or other software operating on the host to re-enumerate the configurable IC die. The re-enumeration request may include a request by the hot-plug capable soft switch 95 to the operating system, VMM, BIOS, or other software operating on the host to execute a hot-unplug event for the physical function that is being re-configured from first circuit device to second circuit device. For the hot-unplug event, the operating system, BIOS, VMM, or other software operating on the host, unload drivers operating on the host for the first circuit device, remove driver parameters for the first circuit device, or make other modifications for the first circuit device.

After the hardware management component requests that the hot-plug capable soft switch invoke the hot-unplug event, the hardware management component may change circuitry logic to represent the functionality of the second circuit device and then change configuration settings that identify the functionality.

Thereafter, the hardware management component may change the physical function of the reconfigurable PR slot. That is, the hardware management component may control the reconfigurable PR slot to switch the physical function that the reconfigurable PR slot presents to the host operating system, BIOS, VMM, or other software operating on the host. The reconfigurable PR slot may switch the physical function presented from the physical function for the first circuit device to a physical function to the second circuit device. For example, the physical function of the reconfigurable PR slot may be switched from a physical function for a lookaside accelerator to a physical function for a NIC, an NVMe controller, or another circuit device. Generally, one physical function (e.g., for the hardware management component) of the configurable IC die changes the configuration space of another physical function (e.g., for the reconfigurable PR slot) of the configurable IC die. Thereby, the PCIe identity (e.g., the persona) of the configurable IC die may be switched from the PCIe identity (e.g., a first persona of the configurable IC die) for the first circuit device to the PCIe identity (e.g., a second persona of the configurable IC die) for the second circuit device.

After the hardware management component changes the physical function presented by the reconfigurable PR slot, the hardware management component may request a physical function configuration space change to represent the change to the second circuit device.

The re-enumeration request may also include a request by the hardware management component to the hot-plug capable soft switch 95 to invoke a hot-plugin event. Thereafter, the hot-plug capable soft switch may request the operating system, VMM, BIOS, or other software operating on the host to execute a hot-plugin event. In response to the request to execute the hot-plugin event, the operating system, BIOS, VMM, or other software operating on the host will re-enumerate the physical function for the reconfigurable PR slot for the second circuit device.

During re-enumeration of the configurable IC die, the second PCIe identity (e.g., second persona) of the second circuit device will be exposed by the reconfigurable PR slot to the operating system, BIOS, VMM, or other software operating on the host. The operating system, BIOS, VMM, or other software operating on the host will retrieve the second PCIe identity for the second circuit, such as a vendor identifier, a device identifier, a revision identifier, a programming interface identifier, a class code identifier, a base class code, a subsystem vendor identifier, a subsystem subclass code, other identifiers, or any combination of these identifiers. The operating system, BIOS, VMM, or other software operating on the host will install and configure any necessary drivers for the second circuit. Thereafter, the second circuit device of the configurable IC die may operate in the host as a compliant PCIe device. In various embodiments, the foregoing described order of operations may be changed. For example, the hardware management component may reconfigure the reconfigurable PR slot prior to requesting that the hot-plug capable soft switch requests the hot-unplug event.

Figure 2:
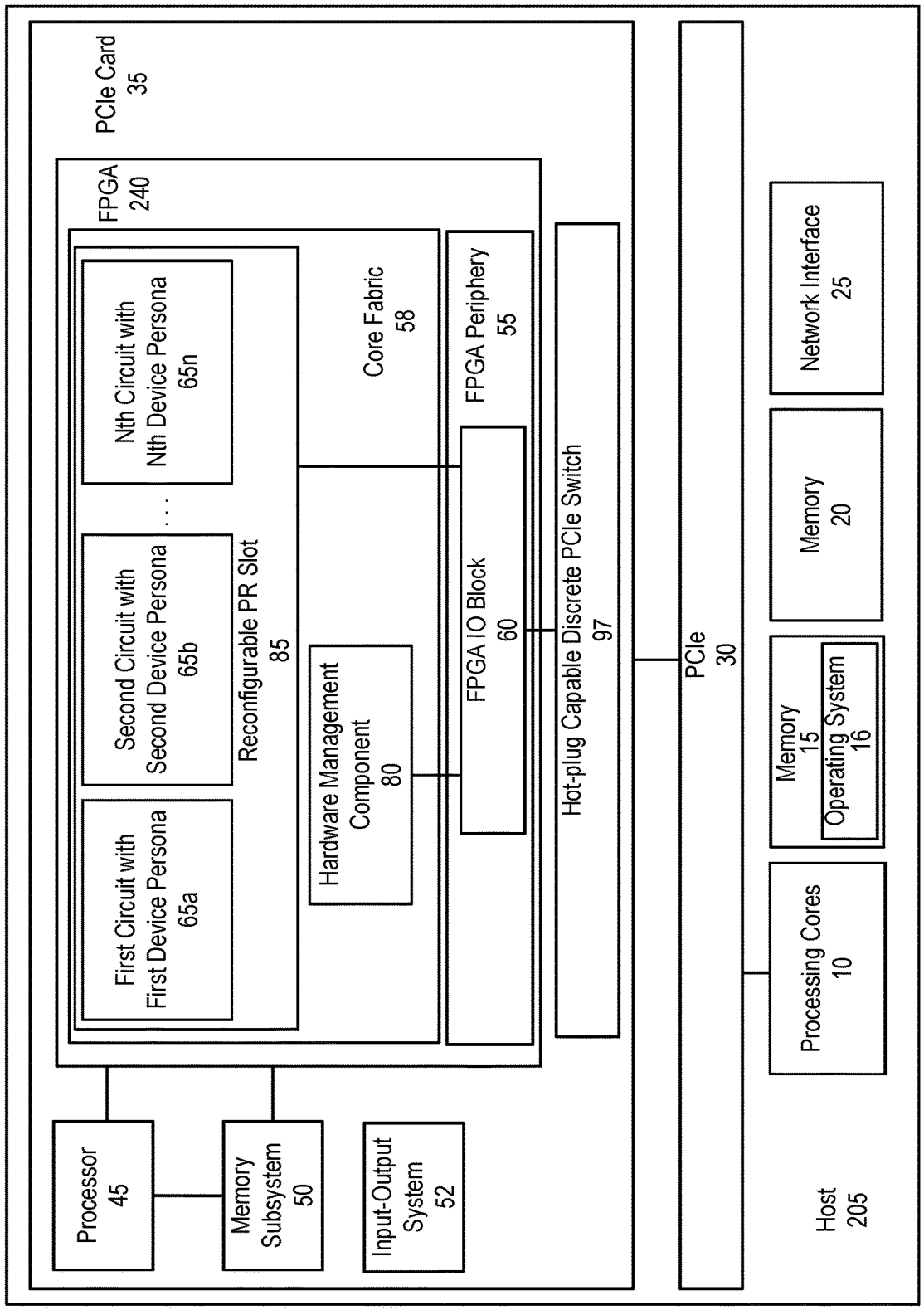
FIG. 2 illustrates a host that includes a configurable IC die, such as an FPGA, in another embodiment.

FIG. 2 illustrates a host 205 that includes a configurable IC die 240, such as an FPGA, in an embodiment. Host 205 is similar to host 5, but differs in that the hot-plug switch is a hardware switch 97 that is external to the configurable IC die. The hot-plug switch 97 may be a hot-plug capable discrete PCIe switch. The die for the hot-plug switch may be on card 35, which may be a PCIe card. Alternatively, the die for the hot-plug switch may be in the host, such as on the host motherboard, on a processor die, on a different card, such as a different PCIe card.

Host 205 may be configured to operate similarly to host 5 to switch the circuit device operating on the configurable IC die from a first circuit device having a first persona (e.g., first PCIe identity) to a second circuit device having a second persona (e.g., a second PCIe identity), which may be partially or entirely different from the first persona.

Specifically, the physical function of the hardware management component may receive a request to switch the circuit device operating on the configurable IC die from the first circuit device to the second circuit device.

Thereafter, the hardware management component may issue a request to the hot-plug capable discrete switch 97 to issue a re-enumeration request to the operating system, the BIOS, the VMM, or other software operating on the host to re-enumerate the configurable IC die. The re-enumeration request may include a request by the hot-plug capable discrete switch 97 to the operating system, BIOS, the VMM, or other software operating on the host to execute a hot-unplug event for card 35. For the hot-unplug event, the operating system, BIOS, the VMM, or other software operating on the host may unload drivers operating on the host for the first circuit device, remove driver parameters for the first circuit device, or make other modifications for the first circuit device.

After the hardware management component requests that the hot-plug discrete switch invoke the hot-unplug event, the hardware management component may change circuitry logic to represent the functionality of the second circuit device and then change configuration settings that identify the functionality.

Thereafter, the physical function of the hardware management component may change the physical function of the reconfigurable PR slot. That is, the hardware management component may control the reconfigurable PR slot to switch to the physical function presented by the reconfigurable PR slot from the physical function for the first circuit device to the physical function to the second circuit device.

After the hardware management component changes the physical function presented by the reconfigurable PR slot, the hardware management component may request a physical function configuration space change to represent the change to the second circuit device.

The re-enumeration request may also include a request by the hot-plug discrete switch to the operating system, BIOS, the VMM, or other software operating on the host to execute a hot-plugin event. In response to the request to execute the hot-plugin event, the operating system, BIOS, the VMM, or other software operating on the host may re-enumerate the reconfigurable PR slot for the second circuit device. During re-enumeration, the second PCIe identity (e.g., second persona) of the second circuit device will be exposed by the reconfigurable PR slot to the operating system, BIOS, the VMM, or other software operating on the host. The operating system, BIOS, the VMM, or other software operating on the host will retrieve the second PCIe identity for the second circuit, such as a vendor identifier, a device identifier, a revision identifier, a programming interface identifier, a class code identifier, a base class code, a subsystem vendor identifier, a subsystem subclass code, other identifiers, or any combination of these identifiers. The operating system, BIOS, the VMM, or other software operating on the host will install and configure any necessary drivers for the second circuit. Thereafter, the second circuit device of the configurable IC die may operate in the host as a compliant PCIe device.

Figure 3:
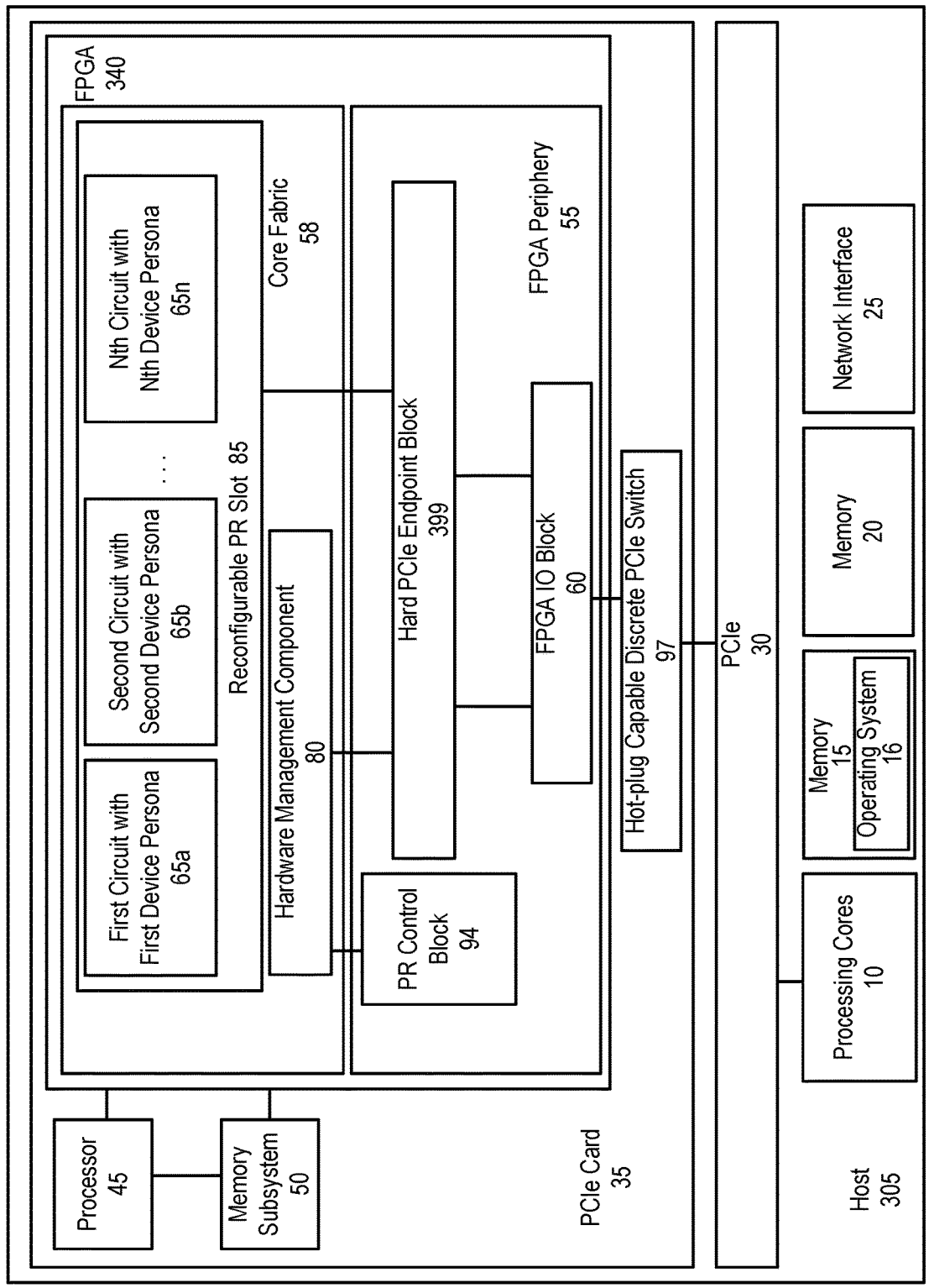
FIG. 3 illustrates a host that includes a configurable IC die, such as an FPGA, in another embodiment.

FIG. 3 illustrates a host 305 that includes a configurable IC die 340, such as an FPGA, in an embodiment. Host 305 is similar to hosts 5 and 205, but differs in that the periphery 55 of the configurable IC die 305 includes a hard PCIe endpoint block 399. The hard PCIe endpoint block 399 is a hardened circuit that is located in the periphery 55 of the configurable IC die. The hardened PCIe endpoint block 399 is positioned between the hardware management component 80 and the IO block 60. The hardened PCIe endpoint block 399 is also positioned between the circuit devices of the reconfigurable PR slot 85 and the IO block 60. The configurable IC die also includes a partial reconfiguration (PR) control block 94 that is located in the periphery 55 and is coupled to the hardware management component or another element of the configurable IC die. The hardened PCIe endpoint block allows the configurable IC die to initiate data transfer between main memory of the host and the PCIe endpoint block, therefore, removing some processing from other portions of the host such as the processing cores. The PCIe endpoint block may also expose the physical function for the hardware management component and the reconfigurable PR slot. The PR block allows for one or more portions of the configurable IC die to remain operational while the functionality of another portion of the configurable IC die is changed. The PR block allows the configurable IC die to keep communication links alive during reconfiguration of the configurable IC die when one circuit device is deactivated and another circuit device is activated.

Host 305 may otherwise operate similarly to hosts 5 and 205 described above for changing device personas and re-enumeration so that a second circuit device may operate on the configurable IC die when the configurable IC die switches from operation of a first circuit device to the second circuit device. Thus, the host will be reconfigured to recognize the device persona of the second circuit device.

Figure 4:
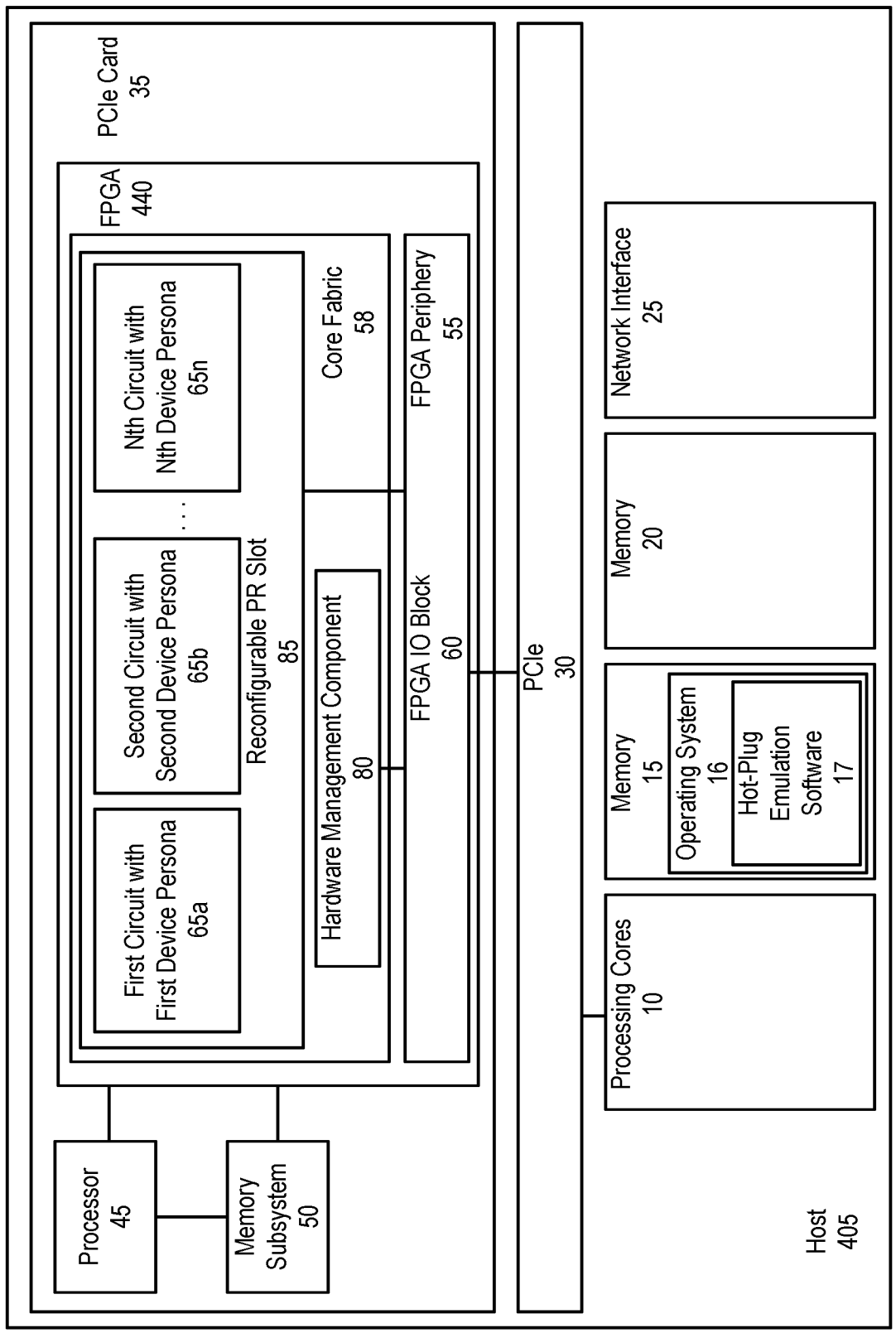
FIG. 4 illustrates a host that includes a configurable IC die, such as an FPGA, in another embodiment.

FIG. 4 illustrates a host 405 that includes a configurable IC die 440, such as an FPGA, in an embodiment. Host 405 is similar to hosts 5, 205, and 305, but differs in that the host operating system 16, BIOS, the VMM, or other software operating on the host includes hot-plug emulation software 17 located in memory 15. The hot-plug emulation software is adapted to execute a simulated hot-unplug event, a simulated hot-plugin event, or both. The hot-plug emulation software may trigger a hot-unplug event, a hot-plugin event, or both based on one or more signals received that request such event. The requests for the event may be received from a client system, the management module of the configurable IC die, or other hardware or software.

During the hot-unplug event, the hot-plug emulation software may clear one or more memory stacks for the operating system, BIOS, the VMM, or other software operating on the host where the memory stacks contain information for a first circuit device that is being disabled on the configurable IC die and a second circuit device that is being enabled on the configurable IC die.

Thereafter, during the simulated hot-plugin event, the hot-plug emulation software may re-enumerate the PCIe card to discover any circuit devices exposed by the reconfigurable PR slot of the configurable IC die. After the hot-plug emulation software determines the PCIe identity of the second circuit device, the hot-plug emulation software may load any appropriate drivers for the second circuit device. Thereafter, the second circuit device of the configurable IC die may operate in the host as a compliant PCIe device.

Figure 5:
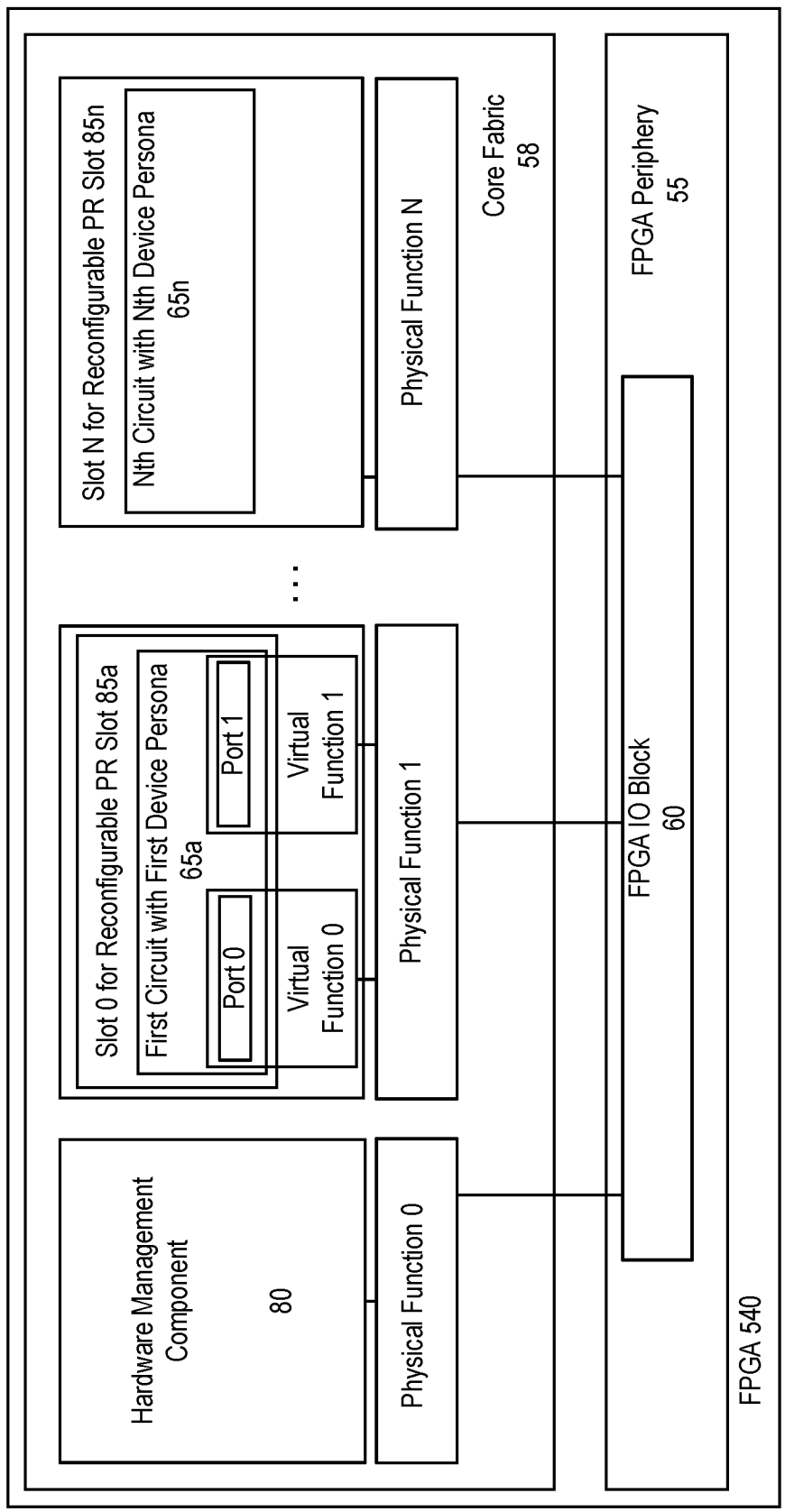
FIG. 5 illustrates a configurable IC die, such as an FPGA, in an embodiment.

FIG. 5 illustrates a configurable IC die 540, in an embodiment. The configurable IC die may be an FPGA or another configurable device. Configurable IC die 540 is similar to configurable IC dies 40, 240, 340, and 440 described above but differs in that configurable IC die 540 includes a first reconfigurable PR slot 85a and at least a second reconfigurable PR slot 85n. In some embodiments, the configurable IC die includes more than two reconfigurable PR slots.

The configurable IC die includes a first circuit device 65a, such as a NIC, assigned to slot 0 for the first reconfigurable PR slot. The first circuit device may include one or more ports. In an embodiment, the first circuit device includes a first port, labeled port 0, and a second port, labeled port 1. Each port may be assigned to a virtual function. In an embodiment, port 0 is assigned to a first virtual function, labeled VF0, and port 1 is assigned to a second virtual function 1, labeled VF1. The first and second virtual functions may be PCIe virtual functions.

The first circuit device may be assigned to a second physical function, labeled PF1. The second physical function may be a PCIe physical function that presents the PCIe identity of the first circuit device to the operating system, BIOS, the VMM, or other software operating on the host. The PCIe identity may be presented when the configurable IC die is enumerated and when the configurable IC die is re-enumerated, for example, at the request of the hardware management component. The second physical function may route packets to the first and second virtual functions, for example, based on information in the packets received by the second physical function. The packets may be stored in virtual memory stacks by the first and second virtual function until the packets are retrieved for use by the first circuit device.

The configurable IC die includes a second circuit device 65n, such as an NVMe, assigned to slot 1 for the second reconfigurable PR slot 85n. The second circuit device may be assigned to a third physical function, labeled PF2. The third physical function may be a PCIe physical function that presents the PCIe identity of the second circuit device to the operating system, BIOS, the VMM, or other software operating on the host. The PCIe identity may be presented when the configurable IC die is enumerated and when the configurable IC die is re-enumerated, for example, at the request of the hardware management component.

The hardware management component 80 may be assigned to a first physical function, labeled PF0. The first physical function may be a PCIe physical function that presents the PCIe identity of the hardware management component to the operating system, the BIOS, the VMM, or other software operating on the host. The PCIe identity may be presented when the configurable IC die is enumerated. The hardware management component may reconfigure PF1, PF2, or both so that one or both of these physical functions may present changes in the device identities of the circuit devices of the configurable IC die. The hardware management component may reconfigure the configurable IC die as described above so that various circuit devices may operate on the configurable IC die. The hardware management component may also initiate re-enumeration of PF1, PF2, or both via a request to a hot-plug capable soft switch, a hot-plug capable discrete PCIe switch, or hot-plug emulation software operating on the host.

Figure 6:
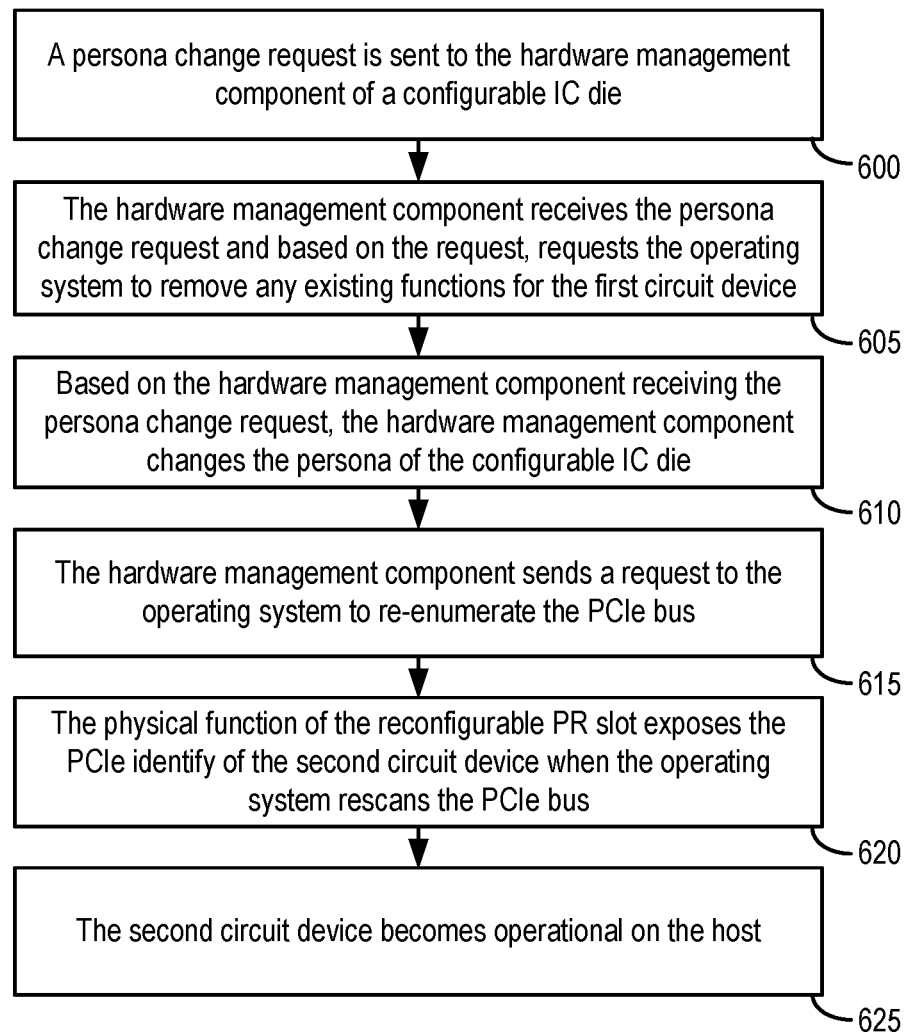
FIG. 6 is a flow diagram of a method of operation of changing a persona of a configurable IC die and changing host settings to recognize the persona change without the host rebooting.

FIG. 6 is a flow diagram of a method of changing a persona of a configurable IC die and changing host settings to recognize the persona change using one or both of a hot-unplug event and a hot-plugin event. The persona change may thereby occur without a host reboot. The flow diagram represents one example embodiment. Steps may be added to, removed from, or combined in the flow diagram without deviating from the scope of the embodiment.

At 600, a persona change request is sent to the hardware management component 80 of the configurable IC die 40. The persona change request may be sent to the hardware management component from other host 5 components. The request may be made if a client system, for example, requests a host resource where the host resource is one of the circuit devices (e.g., one of circuit devices 65a, 65b . . . 65n) that the configurable IC die is configured to provide, and the requested host resource is not the active circuit device that is operating on the configurable IC die at the time the request for the host resource is issued.

At 605, the hardware management component receives the persona change request and based on the received request, thereafter requests that a host re-enumeration component of the operating system, BIOS, the VMM, or other software operating on the host remove one or more existing functions for the first circuit device.

Based on the received request to remove the one or more existing functions for the first circuit device, the host re-enumeration component triggers the operating system, BIOS, the VMM, or other software operating on the host to remove one or more functions for the first circuit device by causing an unplug event for card 35. The unplug event is sometimes referred to as a hot-unplug event. In an embodiment, a request for the hardware unplug event is issued by the hot-plug capable discrete PCIe switch 195 based on a request received by the switch from the hardware management component.

In another embodiment, a request for the software unplug event is issued by the hot-plug capable soft PCIe switch 95 based on a request received by the switch from the hardware management component. In another embodiment, the hardware unplug event is emulated by the hot-plug emulation software 17 of the host operating system, BIOS, the VMM, or other software operating on the host where that host re-enumeration component of the operating system, BIOS, the VMM, or other software operating on the host triggers the unplug event in the operating system, BIOS, the VMM, or other software operating on the host.

At 610, based on the hardware management component receiving the persona change request, the hardware management component changes the persona of the configurable IC die. The hardware management component may change the persona of the configurable IC die by modifying one or more physical functions (e.g., PCIe physical functions) of the configurable IC die. For example, the hardware management component may change the persona of the configurable IC die by modifying the physical function of the reconfigurable PR slot. That is, one physical function (e.g., the physical function of the hardware management component) of the configurable IC die changes another physical function (e.g., the physical function of the reconfigurable PR slot) of the configurable IC die so that the PCIe identity of the configurable IC die is changed. More specifically, the PCIe identity of the reconfigurable PR slot may be changed from a first PCIe identity for the first circuit device to a second PCIe identity for the second circuit device.

In addition to changing the physical function of the reconfigurable PR slot, the hardware management component may also make other changes to the configurable IC die based on the receipt of the change of persona request. For example, after the hardware management component requests the hot-unplug event, the hardware management component may change circuitry logic to represent the functionality of the second circuit device and then change configuration settings that identify the functionality. Additionally, after the hardware management component changes the physical function presented by the reconfigurable PR slot, the hardware management component may request a physical function configuration space change to represent the change to the second circuit device.

The PCIe identities for the first and second circuit devices may have one or more identity elements that are the same. Thus, one or more of the identity elements may not be changed when the first PCIe identity is changed to the second PCIe identity. Alternatively, if the PCIe identities of the first and second circuit devices do not have any identity elements that are the same, then each of the identity elements of the PCIe identity may be changed when the first PCIe identity is changed to the second PCIe identity. The PCIe identities may include identity elements, such as a vendor identifier, a device identifier, a revision identifier, a programming interface identifier, a class code identifier, a base class code, a subsystem vendor identifier, a subsystem subclass code, identifiers for specific PCIe capabilities such as SR-IOv, address translation services (ATS), Process Address Space ID (PASID), page request interface (PRI), other identifiers, or any combination of these identifiers. The change to device persona information may include addition, removal, or modification of information, such as addition, removal, or modification of specific PCIe capabilities such as SR-IOv, ATS, PASID, PRI, other identifiers, or any combination of these identifiers.

At 615, the hardware management component sends a request to the operating system, BIOS, the VMM, or other software operating on the host for the host re-enumeration component to rescan (i.e., re-enumerate) the PCIe bus to discover the physical functions presented by the reconfigurable PR slot of the configurable IC die. In one embodiment, the hardware management component is also rescanned. In another embodiment, the hardware management component is not rescanned.

Based on the received request, the host re-enumeration component of the operating system, BIOS, the VMM, or other software operating on the host triggers the host operating system, BIOS, the VMM, or other software operating on the host to rescan the PCIe bus. The rescan by the operating system, BIOS, the VMM, or other software operating on the host may use either a hardware plugin event or may emulate a hardware plugin event using hot-plug emulation software 17.

At 620, the physical function of the reconfigurable PR slot exposes the PCIe identity of the second circuit device when the operating system, BIOS, the VMM, or other software operating on the host rescans the PCIe bus. The physical function of the hardware management component also exposes its PCIe identity to the operating system, BIOS, the VMM, or other software operating on the host when the operating system, BIOS, the VMM, or other software operating on the host rescans the PCIe bus. Thereby, the operating system, BIOS, the VMM, or other software operating on the host discovers the physical function for the second circuit device and discovers the PCIe identity for the second circuit device. The operating system, BIOS, the VMM, or other software operating on the host may then retrieve any drivers for the second circuit device from memory and configure one or more settings for the drivers.

At 625, the second circuit device becomes operational on the configurable IC die and on the host.

Figure 7:
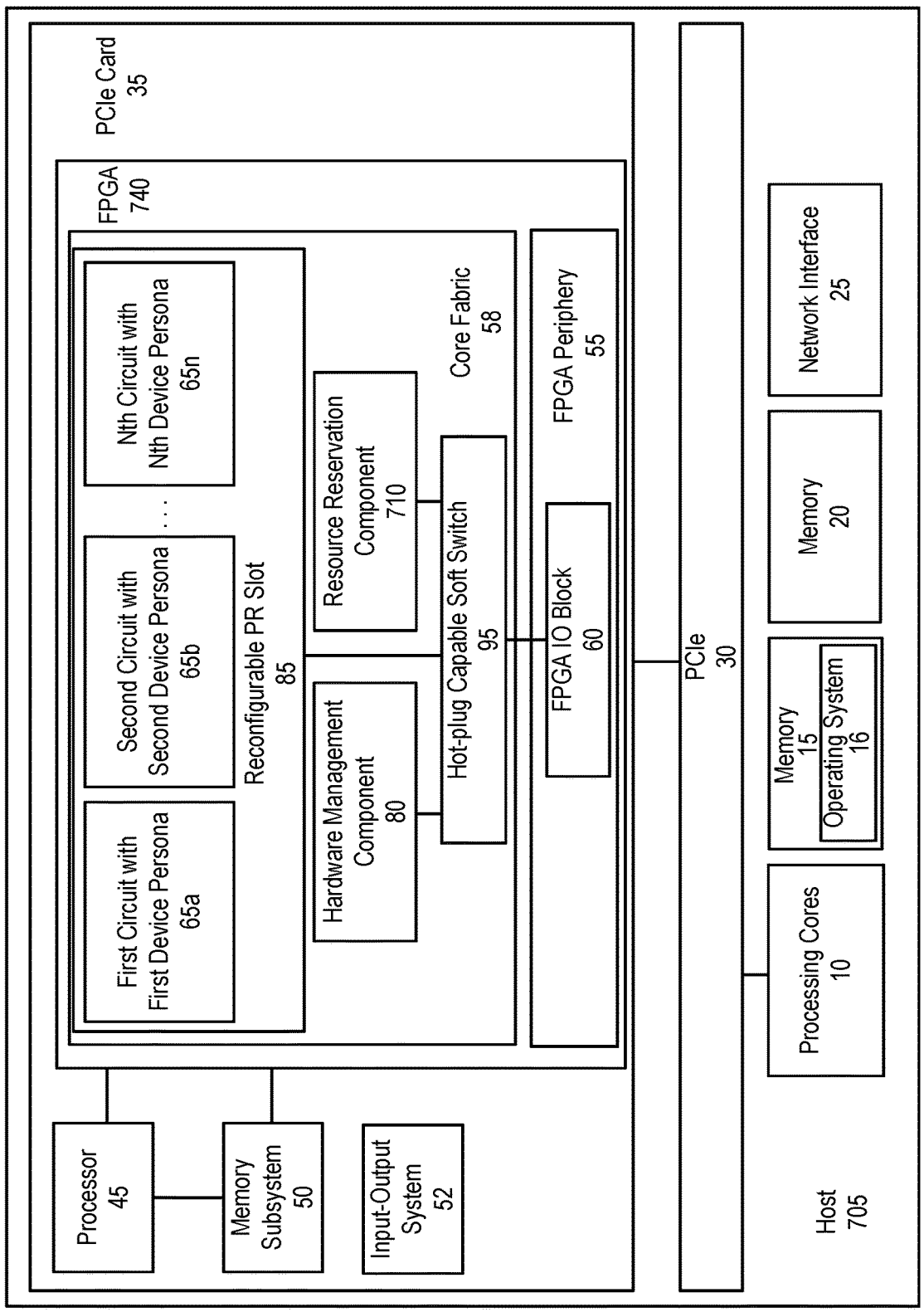
FIG. 7 illustrates a host that includes a configurable IC die, such as an FPGA, in an embodiment.

FIG. 7 illustrates a host 705 that includes a configurable IC die 740, such as an FPGA, in an embodiment. Host 705 is similar to host 5, but differs in that the configurable IC die includes a resource reservation component 710, such as a PCIe resource reservation component. The resource reservation component may be a PCIe physical function. The resource reservation component may be located in the core fabric of the configurable IC die. In one embodiment, the resource reservation component is included in the hardware management component. In another embodiment, the resource reservation component is not included in the hardware management component.

The physical functions of the resource reservation component 710, the reconfigurable PR slot 85, and the hardware management component 80 are adapted to expose the resource usage requirements to the host. The exposed resource usage requirements are the resource usage requirements of the resource reservation component 710, the reconfigurable PR slot 85, and the hardware management component 80.

A resource usage requirement exposed by a physical function may include an address range and may include one or more other resources. An address range may include an IO address range, a resource range, a memory address range, a bus address range, or any combination of these ranges and resources. The reserved host resources may include a memory-mapped IO (MMIO), an IO port, a bus-device-function number (e.g., requester ID), or any combinations of these resources.

During an initial enumeration, which occurs during a time period when the host is powering up and booting, the physical function of the resource reservation component 710 exposes the resource usage requirement of a circuit device that has a larger resource usage requirement than each of the other circuit devices, respectively. For example, if the first circuit device 65a has a larger resource usage requirement than any other of the circuit devices (e.g., second circuit device 65b to the nth circuit device 65n), respectively, then the physical function of the resource reservation component will expose this largest resource usage requirement during the initial enumeration.

During the initial enumeration, the physical function of the reconfigurable PR slot 85 exposes a zero resource or a relatively small (e.g., minimal) usage requirement (e.g., a zero address range or an address range for about one system page) to the host operating system, the BIOS, the VMM, or other software operating on the host. During a re-enumeration that follows the initial enumeration, the physical function of the reconfigurable PR slot may expose a resource usage requirement for a circuit device that is scheduled to operate on the configurable IC die.

During the initial enumeration, the physical function of the hardware management component 80 exposes a resource usage requirement to the host operating system, the BIOS, the VMM, or other software operating on the host. The exposed usage resource requirement is the usage resource requirement for the hardware management component.

The resource usage requirements exposed by the physical functions of the resource reservation component, the reconfigurable PR slot, and the hardware management component are a cumulative resource usage requirement. The cumulative resource usage requirement may be a cumulative address range of the resource usage requirements that are exposed by the physical functions. Based on the cumulative resource usage requirement, the host reserves various host resources.

In an embodiment, the cumulative resource usage requirement determined for the initial enumeration remains constant and the resources reserved by the host for the cumulative resource usage requirement remains constant. No later modification may be made by the operating system, BIOS, VMM, or other host software to the reserved host resources when the host re-enumerates the configurable IC die. The reserved host resources are a fixed amount of resources that are available to the resource reservation component, the reconfigurable PR slot, and the hardware management component.

Specifically, during a re-enumeration, if the resource usage requirement exposed by one of the physical functions of the resource reservation component, the reconfigurable PR slot, or the hardware management component increases, then the resource usage requirement of one or both of the other physical functions that did not increase, will be decreased. For example, during an initial enumeration of the configurable IC die, the physical function for the resource reservation component may expose a first resource usage requirement (e.g., a first address range) that is non-zero. The first resource usage requirement may be for a first circuit device (e.g., circuit device 65a) having a largest resource usage requirement compared to each of the other circuit device (e.g., circuit devices 65b . . . 65n), respectively. The physical function for the reconfigurable PR slot may expose a second resource usage requirement (e.g., a second address range) that may be zero. The physical function for the hardware manager component may expose a third resource usage requirement (e.g., a third address range) that is non-zero.

During subsequent re-enumeration that follows the initial enumeration, the physical function for the resource reservation component may expose a fourth resource usage requirement (e.g., a fourth address range) that is different from the first resource usage requirement. The physical function for the reconfigurable PR slot may expose a fifth resource usage requirement (e.g., a fifth address range). The fifth resource usage requirement may be a resource usage requirement for a circuit device that is scheduled to operate on the configurable IC die. For example, the configurable IC die may switch from operating a first circuit device (e.g., first circuit device 65a) to a second circuit device (e.g., second circuit device 65b) during the re-enumeration. The physical function for the hardware manager component may continue to expose the third resource usage requirement.

The fourth and fifth resource usage requirements may be equal to the first and second resource usage requirements. Therefore, the cumulative resource usage requirement exposed during the re-enumeration may remain unchanged and the reserved host resources may remain unchained.

Configurable IC die 740 provides a number of benefits. For example, during initial enumeration, because the physical function of the resource reservation component exposes a resource usage requirement for a circuit device having a largest resource usage requirement, the host will have sufficiently reserved host resources for this circuit device to operate correctly without host resource constraints. The circuit device with the largest address range may not operate correctly if less than the described required resources are reserved on the host. Further, the circuit devices having smaller resource usage requirements than the largest resource usage requirement will also be able to operate without resource constraints when these devices are selected to operate on the configurable IC die. Also, because the cumulative resource usage requirement of the resource reservation component, the reconfigurable PR slot, and the hardware management component do not change during one or more re-enumerations that follow the initial enumeration, the host may avoid changing the reserved host resources that were reserved for the initial enumerations.

In one embodiment, for the initial enumeration, the cumulative resource usage requirement (e.g., cumulative address range) is stored in one or more memory devices. The one or more memories may include a memory in configurable IC die, a memory in a SiP that the configurable IC die may be packaged in, a memory on the insert card, a memory of the host, another memory, or any combination of these memory devices.

In one embodiment, the cumulative resource usage requirement stored in the memory is not changed as the result of a power down and power up of the host. The host may collect the cumulative resource usage requirement from the memory during power up and may reserve resources for the configurable IC die based on the cumulative resource usage requirement stored in the memory. The cumulative resource usage requirement may be changed if the core fabric of the configurable IC die is reconfigured to include additional, fewer, or different circuit devices. The cumulative resource usage requirement may also be changed based on other trigger events.

Figure 8:
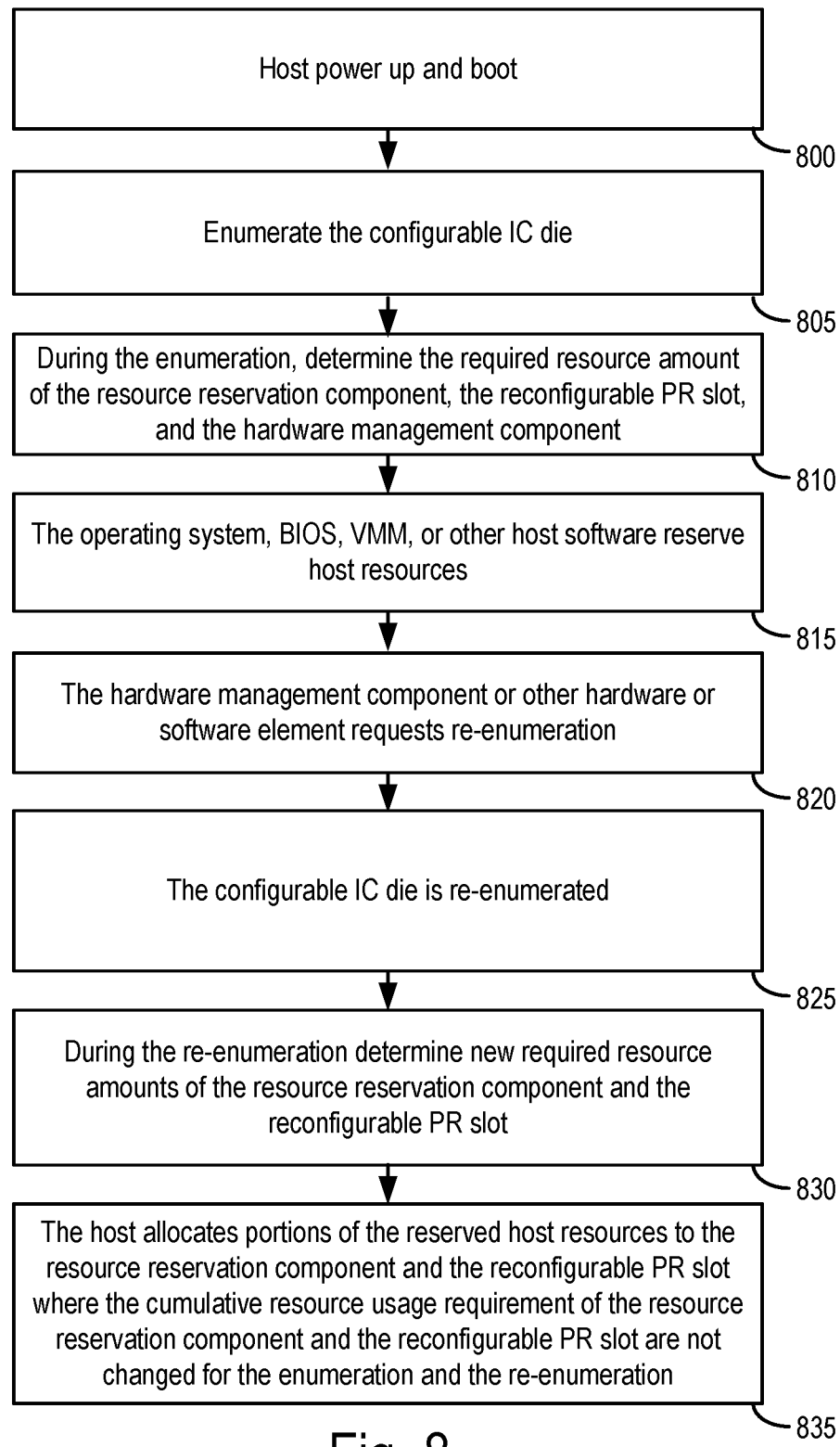
FIG. 8 is a flow diagram of a method of operation for reserving memory in the host for a circuit device of a configurable IC die where the circuit device has a larger memory requirement than other circuit devices of the configurable IC die, such as an FPGA, in an embodiment.

FIG. 8 is a flow diagram of a method of operation for reserving host resources for a configurable IC die and allocating the reserved host resources where the reserved host resources remain unchanged during allocation. The flow diagram represents one example embodiment. Steps may be added to, removed from, or combined in the flow diagram without deviating from the scope of the embodiment.

At 800, host 705 is powered up and boots. Card 35 and configurable IC die 740 mounted on the card are powered up when the host is powered up.

At 805, the configurable IC die is initially enumerated by the host. The initial enumeration occurs during the power up and boot of the host.

At 810, during the initial enumeration of the configurable IC die, the physical function of the resource reservation component exposes a first resource usage requirement (e.g., a first address range) to the operating system, the BIOS, the VMM, or other host software. The first resource usage requirement may be the resource usage requirement of a first circuit device in the core fabric where the first circuit device has a larger resource usage requirement than each of the other circuit devices, respectively, in the core fabric.

During the initial enumeration of the configurable IC die, physical function of the reconfigurable PR slot is adapted to expose a second resource usage requirement (e.g., a second address range) to the operating system, the BIOS, the VMM, or other host software. The second resource usage requirement (e.g., the second address range) may be zero or non-zero. The physical function of the reconfigurable PR slot may also be adapted to expose the device identity (e.g., the PCIe identity) of a circuit device (e.g., an empty or a valid circuit device) that will operate on the configurable IC die following the initial enumeration. The device identity of the circuit device may also be exposed by the physical function of the reconfigurable PR slot to the operating system, the BIOS, the VMM, or other host software that enumerates the configurable IC die.

During the initial enumeration of the configurable IC die, the physical function of the hardware management component is adapted to expose a third resource usage requirement (e.g., a third address range) for the hardware management component. The third resource usage requirement may be non-zero.

At 815, the operating system, the BIOS, VMM, or other host software reserve host resources for the configurable IC die. The reserved host resources are for the first, second, and third resource usage requirements (e.g., the cumulative resource usage requirements). The reserved host resources may include a memory-mapped IO (MMIO), an IO port, a bus-device-function number (e.g., requester ID), or any combinations of these resources based on the address range requirement of the first circuit device. The operating system, the BIOS, VMM, or other host software may also configure the PCIe resource windows of the host and of any other PCIe switches in the path for the configurable IC die.

At 820, the hardware management component or other hardware or software request a re-enumeration of the configurable IC die.

At 825, the configurable IC die is re-enumerated by the host.

At 830, during the re-enumeration, the physical function of the resource reservation component exposes a fourth resource usage requirement (e.g., a fourth address range) to the operating system, the BIOS, the VMM, or other host software.

During the re-enumeration, the physical function of the reconfigurable PR slot is adapted to expose a fifth resource usage requirement (e.g., a fifth address range) to the operating system, the BIOS, the VMM, or other host software. The fifth resource usage requirement (e.g., the fifth address range) may be for a circuit device (e.g., a second circuit device) that will operate on the configurable IC die following the re-enumeration. The device identity of the circuit device (e.g., a second circuit device) may also be exposed by the physical function of the reconfigurable PR slot to the operating system, the BIOS, the VMM, or other host software that enumerates the configurable IC die.

During the initial enumeration of the configurable IC die, the physical function of the hardware management component is adapted to expose a sixth resource usage requirement (e.g., a sixth address range) for the hardware management component. The sixth resource usage requirement may be the same as the third resource usage requirement.

The cumulative resource usage requirement of the first, second, and third resource usage requirement may be the same as the fourth, fifth, and sixth resource usage requirement. Further, the first and second resource usage requirements may be the same as the fourth and fifth usage resource requirements if the third and sixth usage resource requirements remain unchanged from the initial enumeration to the re-enumeration.

At 835, following the re-enumeration, the host may allocate a first portion of the reserved host resources for the resource reservation component. The first portion of reserved host resources may be for the fourth resource usage requirement that was exposed by the physical function of the resource reservation component during the re-enumeration.

Following the re-enumeration, the host may allocate a second portion of the reserved host resources for the circuit device that is scheduled to operate on the configurable IC die after the re-enumeration. The second portion of reserved host resources may be for the fifth resource usage requirement of the circuit device that operates on the configurable IC die after the re-enumeration.

Following the re-enumeration, the host may allocate a third portion of the reserved host resources for the hardware management component. The third portion of reserved host resources may be for the sixth resource usage requirement for the hardware management component.

For the re-enumeration the host may not change the reserved host resources that were reserved by the host for the initial enumeration. Also, for any number of re-enumerations that follow the initial enumeration, the host may not change the reserved host resources that were reserved by the host for the initial enumeration.

The re-enumeration of 820, 825, 830, and 835 may be repeated. For example, the hardware management component may request a subsequent re-enumeration, when the hardware management component receives a request to change the circuit device that operates in the core fabric.

For the repeat of the re-enumeration (e.g., repeat of 820, 825, 830, and 835), the host may vary the portions of the reserved host resources that are allocated to the resource reservation component 710, the reconfigurable PR slot 85, and the hardware management component 80.

For example, the host may vary the portions of the reserved host resources that are allocated to the resource reservation component and the reconfigurable PR slot, but may leave the portion of the reserved host resources that are allocated to the hardware management component. If the circuit devices that operate in the core fabric before and after the repeated re-enumeration are different circuit devices having different resource usage requirements, the host may change the portion of the reserved host resources allocated to the circuit devices. The host may also change the portion of the reserved host resources allocated to the resource reservation component. However, the cumulative portions of reserved host resources allocated to the circuit devices and the resource reservation component prior to the repeated re-enumeration are the same. That is, the amount of the reserved host resources allocated before and after the repeated re-enumeration are constant.

Figure 9:
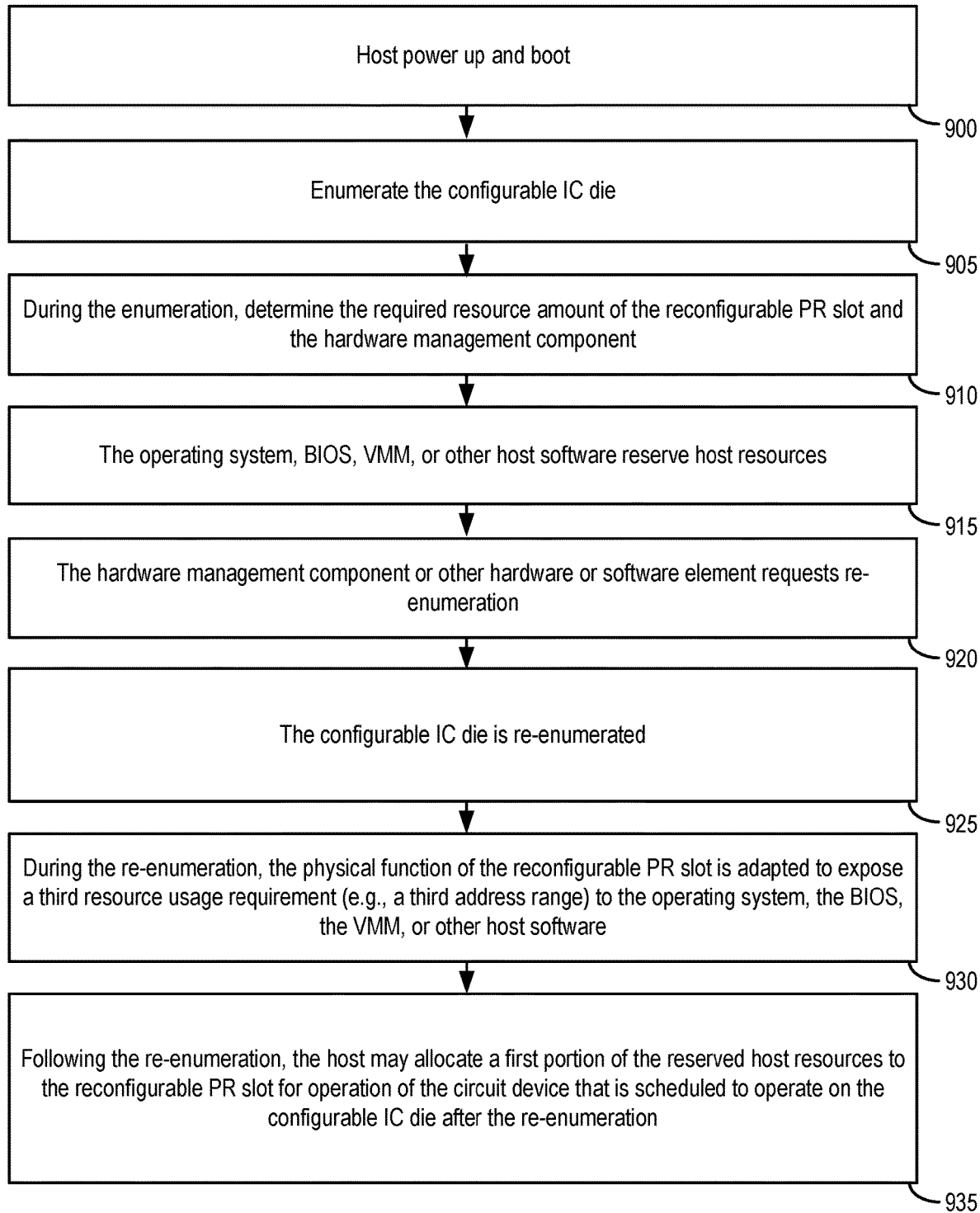
FIG. 9 is a flow diagram of a method of operation of reserving memory in the host memory for a dummy circuit device of a configurable IC die, such as an FPGA, in another embodiment.

FIG. 9 is a flow diagram of a method of operation of one or more of the hosts described in this patent where the configurable IC die may not include a resource reservation component. The flow diagram represents one example embodiment. Steps may be added to, removed from, or combined in the flow diagram without deviating from the scope of the embodiment.

At 900, the host is powered up and boots. The configurable IC die included in the host is powered up when the host is powered up.

At 905, the configurable IC die is initially enumerated by the host. The initial enumeration occurs during the power up and boot of the host.

At 910, during the initial enumeration of the configurable IC die, the physical function of the reconfigurable PR slot is adapted to expose a first resource usage requirement (e.g., a first address range) to the operating system, the BIOS, the VMM, or other host software. The first resource usage requirement (e.g., the first address range) may be a resource usage requirement that is sufficient for any one of the circuit devices in the core fabric to operate appropriately in the host. The hardware management component may be adapted to configure the reconfigurable PR slot to expose the first resource usage requirement during the initial enumeration. Information (e.g., an address range) for the first resource usage requirement may be stored in a memory configurable IC die, a memory of a SiP that the configurable IC die is mounted in, a memory of the PCIe card that the configurable IC die may be mounted on, or other memory. The memories may be FLASH memories or other types of memories.

The physical function of the reconfigurable PR slot may also be adapted to expose the device identity (e.g., the PCIe identity) of a circuit device (e.g., a first circuit device) that will operate on the configurable IC die following the initial enumeration. The device identity of the circuit device may be exposed to the operating system, the BIOS, the VMM, or other host software that enumerates the configurable IC die.

During the initial enumeration of the configurable IC die, the physical function of the hardware management component is adapted to expose a second resource usage requirement (e.g., a second address range) for the hardware management component. The second resource usage requirement may be non-zero.

At 915, the operating system, the BIOS, VMM, or other host software reserve host resources for the configurable IC die. The reserved host resources are for the first and second resource usage requirements (e.g., cumulative resource usage requirements). The reserved host resources may include a memory-mapped IO (MMIO), an IO port, a bus-device-function number (e.g., requester ID), or any combinations of these resources based on the address range requirement of the first circuit device. The operating system, the BIOS, VMM, or other host software may also configure the PCIe resource windows of the host and of any other PCIe switches in the path for the configurable IC die.

At 920, the hardware management component may request a re-enumeration of the configurable IC die.

At 925, the configurable IC die is re-enumerated by the host.

At 930, during the re-enumeration, the physical function of the reconfigurable PR slot is adapted to expose a third resource usage requirement (e.g., a third address range) to the operating system, the BIOS, the VMM, or other host software. The third resource usage requirement (e.g., the third address range) may be for a circuit device (e.g., a second circuit device) that will operate on the configurable IC die following the re-enumeration.

In an embodiment, the first and third resource usage requirements are the same resource usage requirements. In an alternative embodiment, the first and third resource usage requirements are different resource usage requirements. Specifically, the third resource usage requirement may be less than the first resource usage requirement but may not be greater than the first resource usage requirement.

The device identity of the circuit device (e.g., a second circuit device) may also be exposed by the physical function of the reconfigurable PR slot to the operating system, the BIOS, the VMM, or other host software that enumerates the configurable IC die. The hardware management component may be adapted to configure the physical function of the reconfigurable PR slot to expose the third address range and the device identity of the circuit device that will operate on the configurable IC die after the re-enumerations. The hardware management component may receive a request to change the circuit operating on the configurable IC die and configure the physical function of the reconfigurable PR slot as described.

During the re-enumeration of the configurable IC die, the physical function of the hardware management component is adapted to expose a fourth resource usage requirement (e.g., a fourth address range) for the hardware management component. The fourth resource usage requirement may be the same as the second resource usage requirement.

At 935, following the re-enumeration, the host may allocate a first portion of the reserved host resources to the reconfigurable PR slot for operation of the circuit device that is scheduled to operate on the configurable IC die after the re-enumeration. The first portion of the reserved host resources may be for the third resource usage requirement exposed by the physical function of the reconfigurable PR slot during the re-enumeration.

Following the re-enumeration, the host may allocate a second portion of the reserved host resources for the hardware management component. The second portion of the reserved host resources may be for the fourth resource usage requirement exposed by the physical function of the reconfigurable PR slot during the re-enumeration.

For the re-enumeration the host may not change the reserved host resources that were reserved by the host for the initial enumeration at 915. Also, for any number of re-enumerations that follow the initial enumeration, the host may not change the reserved host resources that were reserved by the host for the initial enumeration at 915.

In one embodiment, when first and third resource usage requirements are different and when the second and fourth resource usage requirements are the same, then the first and second portions of the reserved host resources that are allocated to the reconfigurable PR slot and the hardware management component are smaller than the total amount of reserved host resources that were reserved at 915. Further, the first portion of the reserved host resources that are allocated to the reconfigurable PR slot are reduced.

In one embodiment, one or more modules of the configurable IC die may be assigned the amount of reserved host resources that not allocated to the reconfigurable PR slot and the hardware management component, so that the amount of reserved host resources are not changed. The cumulative reserved host resources that includes the first portion of the reserved host resources that are allocated to the reconfigurable PR slot and that amount of resources that are assigned to the one or more modules of the configurable IC die are constant and are not changed during each successive re-enumeration of the configurable IC die.

Figure 10:
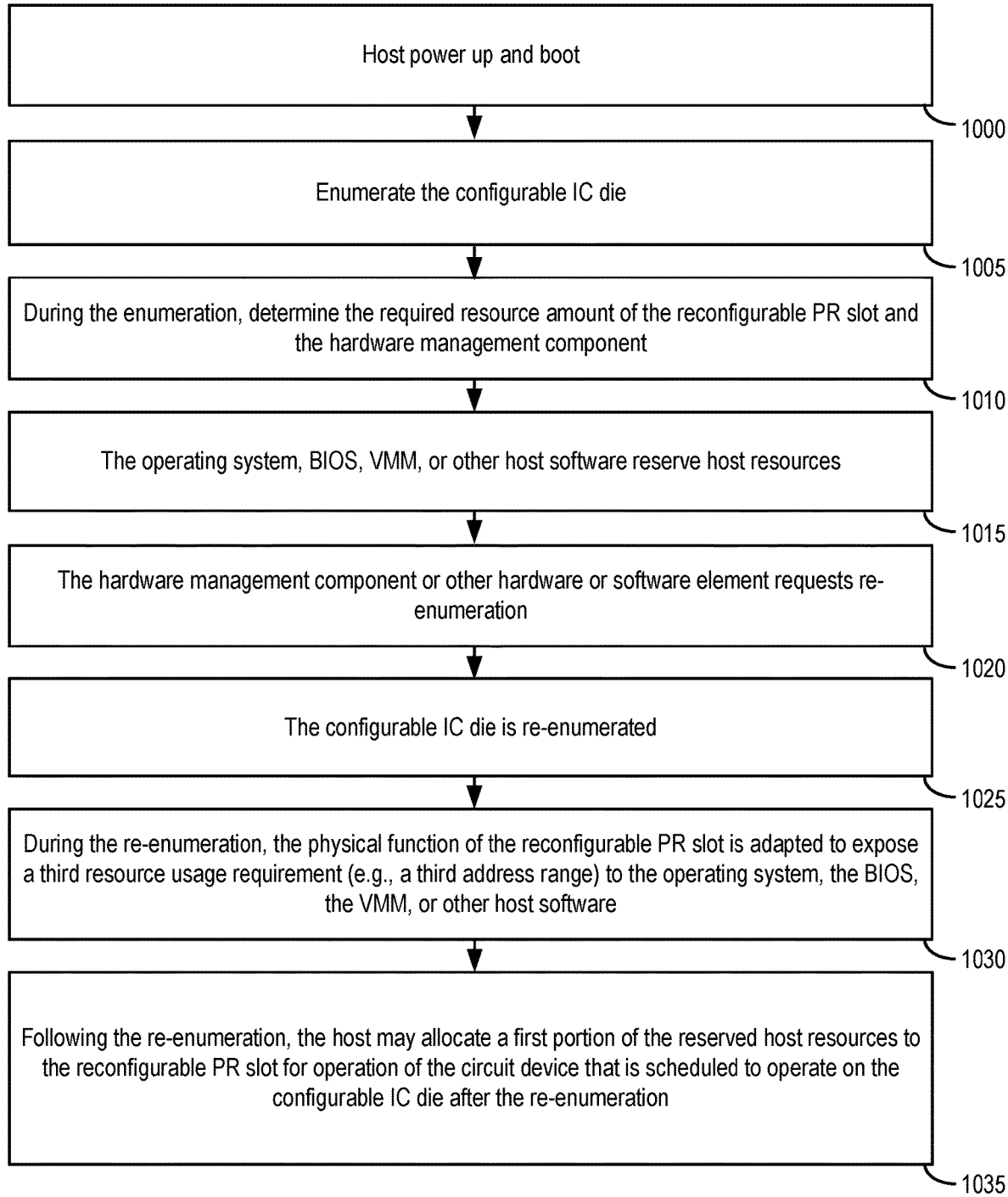
FIG. 10 is a flow diagram of a method of operation of reserving memory in the host memory of a configurable IC die, such as an FPGA, in another embodiment.

FIG. 10 is a flow diagram of a method of operation of one or more of the hosts described in this patent where the configurable IC die may not include a resource reservation component. The flow diagram represents one example embodiment. Steps may be added to, removed from, or combined in the flow diagram without deviating from the scope of the embodiment.

At 1000, the host is powered up and boots. The configurable IC die included in the host is powered up when the host is powered up.

At 1005, the configurable IC die is initially enumerated by the host. The initial enumeration occurs during the power up and boot of the host.

At 1010, during the initial enumeration of the configurable IC die, the physical function of the reconfigurable PR slot is adapted to expose a first resource usage requirement (e.g., a first address range) to the operating system, the BIOS, the VMM, or other host software. The first resource usage requirement (e.g., the first address range) may be a resource usage requirement that is sufficient for any one of the circuit devices in the core fabric to operate appropriately in the host. The hardware management component may be adapted to configure the reconfigurable PR slot to expose the first resource usage requirement during the initial enumeration. Information (e.g., an address range) for the first resource usage requirement may be stored in a memory of the configurable IC die, a memory of a SiP that the configurable IC die is mounted in, a memory of the PCIe card that the configurable IC die may be mounted on, or other memory. The memories may be FLASH memories or other types of memories.

The physical function of the reconfigurable PR slot may also be adapted to expose the device identity (e.g., the PCIe identity) of a circuit device (e.g., a first circuit device) that will operate on the configurable IC die following the initial enumeration. The device identity of the circuit device may also be exposed by the physical function of the reconfigurable PR slot to the operating system, the BIOS, the VMM, or other host software that enumerates the configurable IC die.

During the initial enumeration of the configurable IC die, the physical function of the hardware management component is adapted to expose a second resource usage requirement (e.g., a second address range) for the hardware management component. The second resource usage requirement may be non-zero.

At 1015, the operating system, the BIOS, VMM, or other host software reserve host resources for the configurable IC die. The reserved host resources are based on the first and second resource usage requirements (e.g., the cumulative resource usage requirements) or based on some pre-configured or pre-programmed value fetched from memory or a combination of both. The reserved host resources may include a memory-mapped IO (MMIO), an IO port, a bus-device-function number (e.g., requester ID), or any combinations of these resources based on the address range requirement of the first circuit device. The operating system, the BIOS, VMM, or other host software may also configure the PCIe resource windows of the host and of any other PCIe switches in the path for the configurable IC die.

At 1020, the hardware management component may request a re-enumeration of the configurable IC die.

At 1025, the configurable IC die is re-enumerated by the host.

At 1030, during the re-enumeration, the physical function of the reconfigurable PR slot is adapted to expose a third resource usage requirement (e.g., a third address range) to the operating system, the BIOS, the VMM, or other host software. The third resource usage requirement (e.g., the third address range) may be for a circuit device (e.g., a second circuit device) that will operate on the configurable IC die following the re-enumeration.

In an embodiment, the first and third resource usage requirements are different resource usage requirements. In an alternative embodiment, the first and third resource usage requirements are different resource usage requirements. Specifically, the third resource usage requirement may be less than the first resource usage requirement but may not be greater than the first resource usage requirement.

The device identity of the circuit device (e.g., a second circuit device) may also be exposed by the physical function of the reconfigurable PR slot to the operating system, the BIOS, the VMM, or other host software that enumerates the configurable IC die. The hardware management component may be adapted to configure the physical function of the reconfigurable PR slot to expose the third address range and the device identity of the circuit device that will operate on the configurable IC die after the re-enumerations. The hardware management component may receive a request to change the circuit operating on the configurable IC die and configure the physical function of the reconfigurable PR slot as described.

During the re-enumeration of the configurable IC die, the physical function of the hardware management component is adapted to expose a fourth resource usage requirement (e.g., a fourth address range) for the hardware management component. The fourth resource usage requirement may be the same as the second resource usage requirement.

At 1035, following the re-enumeration, the host may allocate a first portion of the reserved host resources to the reconfigurable PR slot for operation of the circuit device that is scheduled to operate on the configurable IC die after the re-enumeration. The first portion of the reserved host resources may be for the third resource usage requirement exposed by the physical function of the reconfigurable PR slot during the re-enumeration.

Following the re-enumeration, the host may allocate a second portion of the reserved host resources for the hardware management component. The second portion of the reserved host resources may be for the fourth resource usage requirement exposed by the physical function of the hardware management component during the re-enumeration.

For the re-enumeration the host may not change the reserved host resources that were reserved by the host for the initial enumeration at 1015. Also, for any number of re-enumerations that follow the initial enumeration, the host may not change the reserved host resources that were reserved by the host for the initial enumeration at 1015.

When first and third resource usage requirements are the different and when the second and fourth resource usage requirements are the same, then the first and second portions of the reserved host resources that are allocated to the reconfigurable PR slot and the hardware management component are smaller than the total amount of reserved host resources that were reserved at 1015. The difference in the allocated portions of the reserved host resources and the total amount of reserved host resources may be held by the host and may not be allocated for use by the host while the circuit device exposed at 1030 operates in the core fabric of the configurable IC die. However, the sum (i.e., total) of (i) the allocated portion of the reserved host resources and (ii) the difference in the allocated portions of the reserved host resources and the total amount of reserved host resources that are held by the host are equal to the total amount of the reserved host resources that were reserved by the host at 1015.

The re-enumeration of 1020, 1025, 1030, and 1035 may be repeated. For example, the hardware management component may request a subsequent re-enumeration, when the hardware management component receives a request to change the circuit device that operates in the core fabric.

For the repeat of the re-enumeration (e.g., repeat of 1020, 1025, 1030, and 1035), the host may change the portion of the reserved host resources that are allocated to the reconfigurable PR slot 85 and the amount of reserved host resources that remain unallocated for use at 1035.

For example, the host may change the portion of the reserved host resources that are allocated to reconfigurable PR slot and the portion of the reserved host resources that are unassigned, if the circuit devices that operate in the core fabric before and after the repeated re-enumeration are different circuit devices having different resource usage requirements. However, the total of the reserved host resources that were reserved by the host at 1015 remains unchanged. Also, the sum (i.e., total) of (i) the allocated portion of the reserved host resources and (ii) the difference in the allocated portions of the reserved host resources and the total amount of reserved host resources that are held by the host are equal to the total amount of the reserved host resources that were reserved by the host at 1015.

Figure 11:
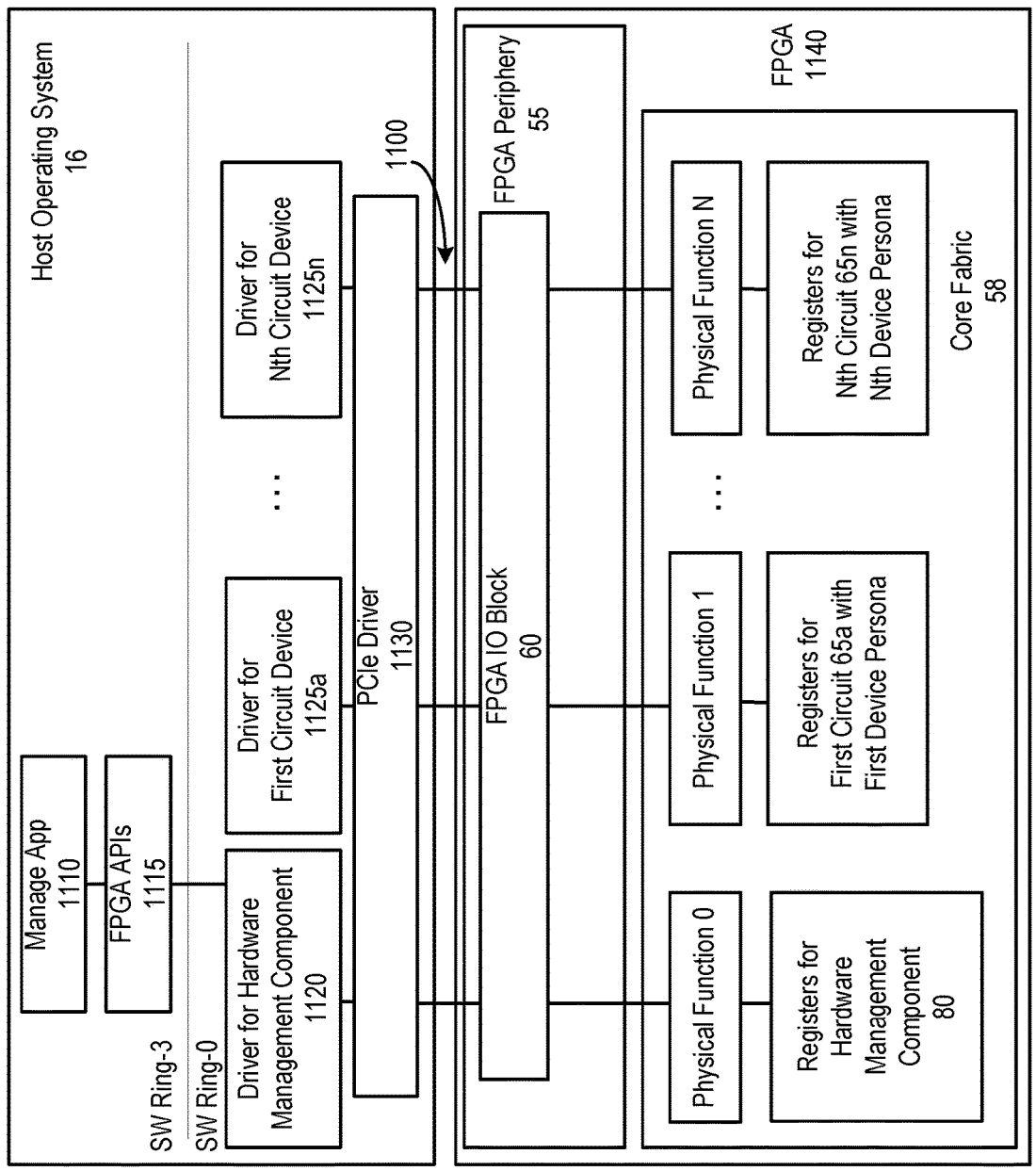
FIG. 11 illustrates elements of a host operating system and communication links from elements of the host operating system to elements of a configurable IC die, in an embodiment.

FIG. 11 illustrates elements of the host operating system 16 and communication links 1100 that link elements of the host operating system to elements of a configurable IC die 1140, in an embodiment. The configurable IC die may be an FPGA.

Configurable IC die 1140 may be the same or similar to any one of the configurable IC dies described above. The configurable IC die may include any of the elements of any of the configurable IC dies described above in any combination, such as a number of circuit device 65*a* . . . 65*n* (e.g., a NIC, an NVMe, or other devices).

The host operating system includes a management application 1110 and configurable IC die APIs 1115. The management application and configurable IC die APIs may reside in ring 0 or ring 3 of the operating system. The host operating system also includes a driver 1120 for hardware management component physical function 80. The host operating system includes one or more device drivers 1125*a* . . . 1125*n* for one or more circuit devices 65*a* . . . 65*n*. The device drivers 1125*a* . . . 1125*n* for the circuit devices 65*a* . . . 65*n* may link to the physical functions and registers for these circuit devices. The host operating system includes one or more PCIe drivers 1130 for a PCIe bus (not shown) and PCIe functions linking host operating system 16 and configurable IC die 1140. Drivers 1120, 1125*a* . . . 1125*n,* and 1130 may reside in ring 0 or ring 3 of the operating system.

In an embodiment, the software architecture is a bare-metal operating system. That is, the software architecture is for a host that is operating without a virtual machine manager (i.e., hypervisor). The operating system and configurable IC die may operate as described above where the operating system adapts to the changing PCIe identities of a changing circuit device operating on the configurable IC die. That is, the PCIe driver 1130 may enumerate and re-enumerate the PCIe physical functions of the PCIe devices (e.g., circuit devices 65*a* . . . 65*n*) operating on the configurable IC die. The PCIe driver 1130 may be initialized and configured for the discovered PCIe devices. Thereafter, device drivers 1125*a* . . . 1125*n* may be initialized and configured.

Figure 12:
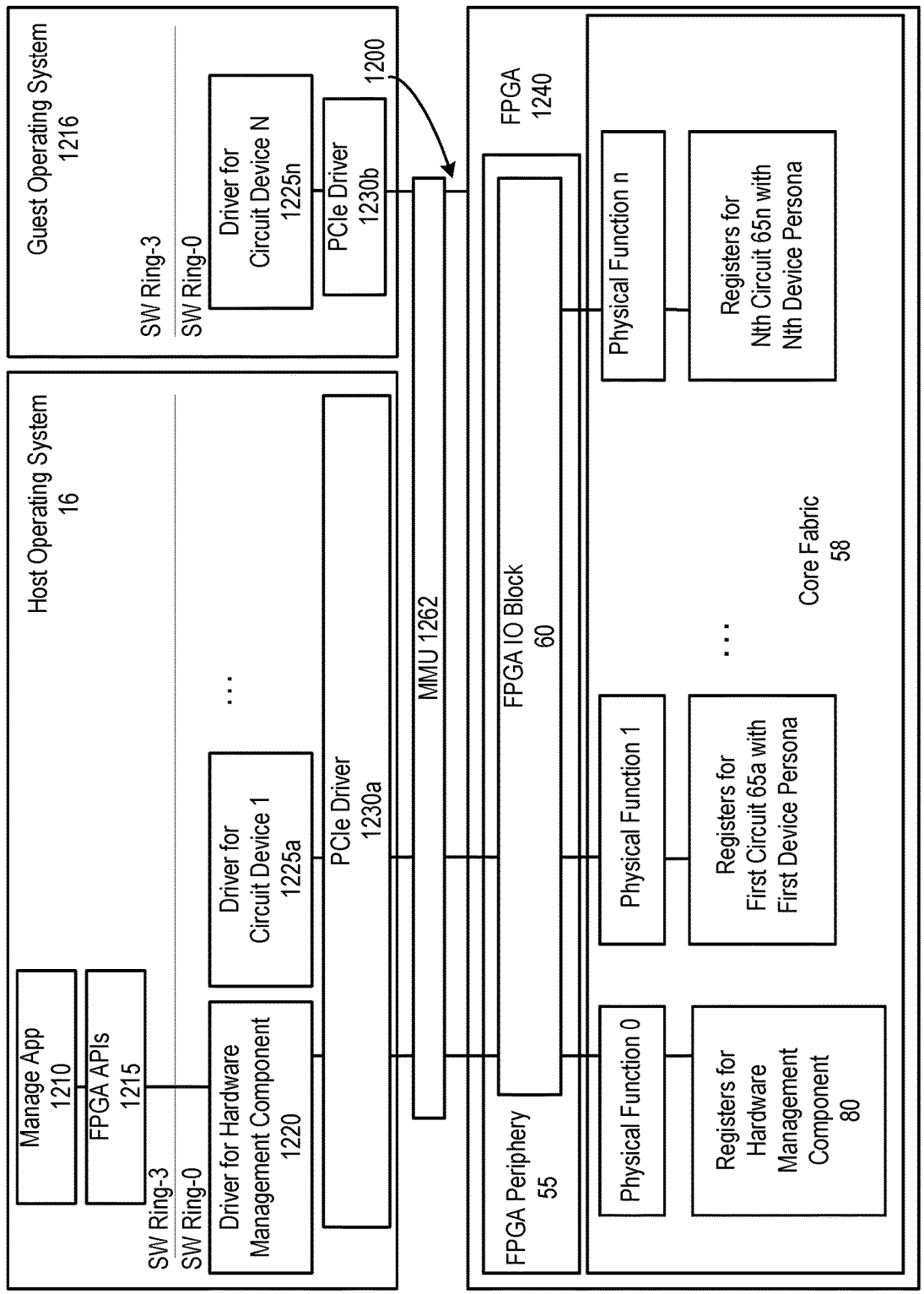
FIG. 12 illustrates elements of the host operating system and communication links that link elements of the host operating system to elements of a configurable IC die, in another embodiment.

FIG. 12 illustrates elements of host operating system 16 and communication links 1200 that link elements of the host operating system to elements of a configurable IC die 1240, in an embodiment. Also illustrated is a guest operating system 1216 where the communication links 1200 link elements of the guest operating system to elements of the configurable IC die. The configurable IC die may be an FPGA.

Configurable IC die 1240 may be the same or similar to any one of the configurable IC dies described above. The configurable IC die may include any of the elements of any of the configurable IC dies described above in any combination, such as a number of circuit devices 65*a* . . . 65*n* (e.g., a NIC, an NVMe, or other devices).

The host operating system includes a management application 1210 and configurable IC die APIs 1215. The management application and configurable IC die APIs may reside in ring 0 or ring 3 of the operating system. The host operating system also includes a driver 1220 for the hardware management component physical function 80. The host operating system includes a device driver 1225*a* for circuit device 65*a*. The host operating system may include additional device drivers for additional circuit devices, such as circuit device 65*b* or other circuit devices. The host operating system includes a PCIe driver 1230 for a PCIe bus (not shown) that links the host operating system 16 and the configurable IC die 1240. Drivers 1220, 1225*a,* and 1230*a* may reside in ring 0 or ring 3 of the operating system. The hardware management component 80 and the circuit device 65*a* are assigned to the drivers of the operating system.

The host includes a guest operating system 1216. The guest operating system 1216 that includes a driver 1225*n* for the nth circuit device of the configurable IC die 1205 and includes a PCIe driver 1230*b*. The physical function for the nth circuit device 65*n* operating on the configurable IC die is assigned to guest operating system 1216 as a PCIe passthrough circuit device to the guest operating system. The drivers 1225*a* . . . 1225*n* for the circuit devices 65*a* . . . 65*n* may link to the physical functions and registers for the circuit devices.

A memory management unit (MMU) 1262, such as an input-output memory management unit (IOMMU), may be positioned between the operating system and the configurable IC die and manages the virtual memory for the operating system and configurable IC die. The MMU may also be positioned between the guest operating system and the configurable IC die and manage the virtual memory for the guest operating system and configurable IC die.

The operating system, guest operating system, and configurable IC die may operate as described above where the operating system and the guest operating adapt to the changing PCIe identities of changing circuit devices operating on the configurable IC die. That is, the PCIe drivers of the operating system and the guest operating system may enumerate and re-enumerate the PCIe physical functions of the PCIe devices (e.g., circuit devices 65*a* . . . 65*n*) operating on the configurable IC die. The PCIe drivers 1230*a* . . . 1230*n* may be initialized and configured for the discovered PCIe devices. Thereafter, device functionality for the drivers for the circuit devices may be initialized and configured. After initialization and configuration, the device functionality may be managed by the drivers for the circuit devices. If the one of the circuit devices 65*a* is configured for operation on the configurable IC die, then the operating system may discover this device during enumeration or re-enumeration, and the guest operating system may not discover the nth circuit device 65*n* if the nth circuit device is not configured to operate. Alternatively, if the circuit devices 65*a* are not configured for operation on the configurable IC die, then the operating system may not discover this device during enumeration or re-enumeration, and the guest operating system may discover the nth circuit device 65*n* if the nth circuit device is configured to operate.

Figure 13:
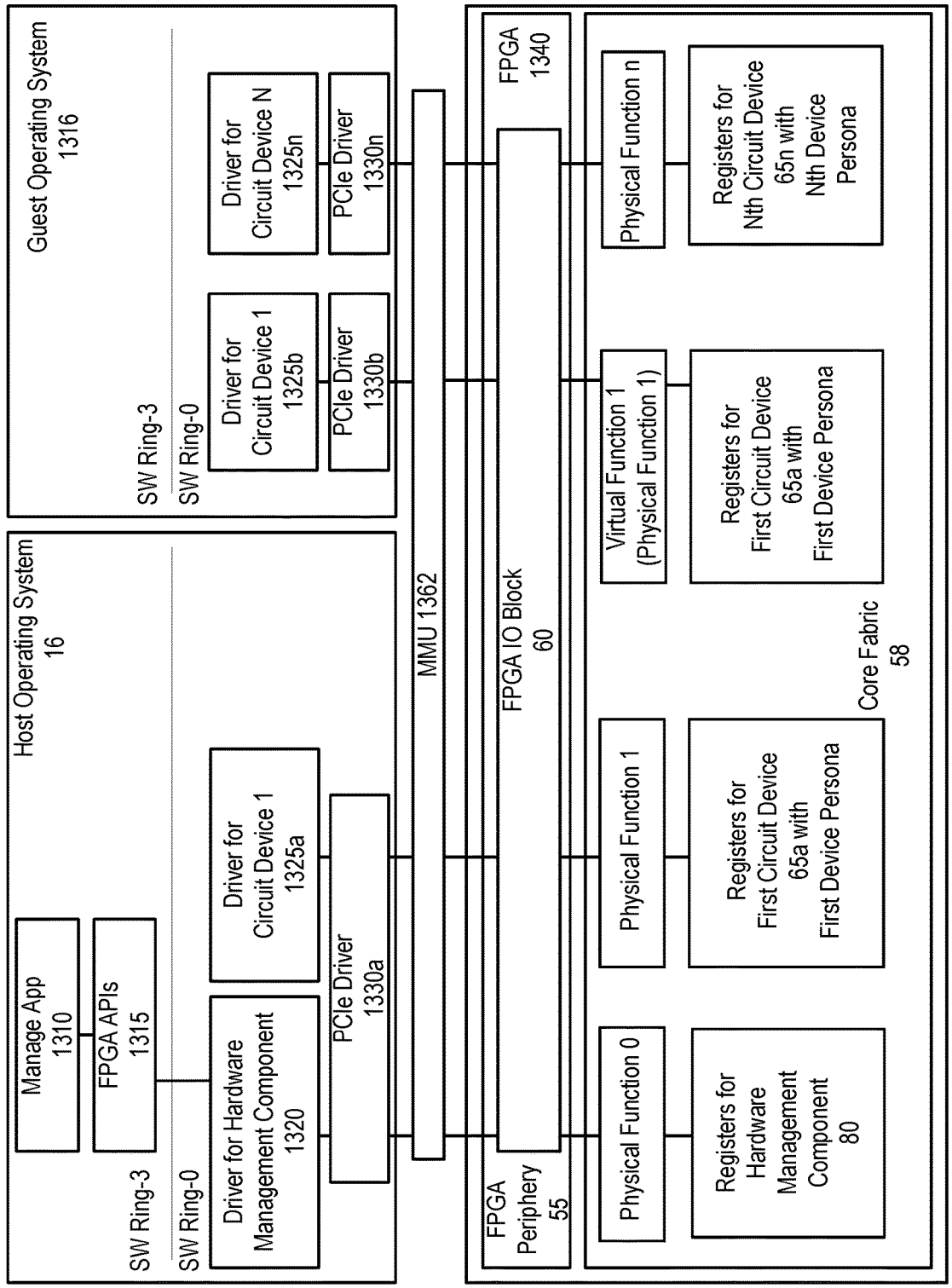
FIG. 13 illustrates elements of a host operating system and communication links that link elements of the host operating system to elements of a configurable IC die, in another embodiment.

FIG. 13 illustrates elements of host operating system 16 and communication links 1300 that link elements of the host operating system to elements of a configurable IC die 1340, in an embodiment. Also illustrated is a guest operating system 1316 where the communication links 1300 link elements of the guest operating system to elements of the configurable IC die. The configurable IC die may be an FPGA.

Configurable IC die 1340 may be the same or similar to any one of the configurable IC dies described above. The configurable IC die may include any of the elements of any of the configurable IC dies described above in any combination, such as a number of circuit devices 65*a* . . . 65*n* (e.g., a NIC, an NVMe, or other devices).

The host operating system includes a management application 1310 and configurable IC die APIs 1315 (FPGA APIs). The management application and configurable IC die APIs may reside in ring 0 or ring 3 of the operating system. The host operating system also includes a driver 1320 for hardware management component physical function 80. The host operating system includes a device driver 1325*a* for circuit device 65*a*. Device driver 1325*a* for circuit device 65*a* may link to the physical functions and registers for circuit device 65*a*.

The host operating system includes a PCIe driver 1330*a* for a PCIe bus (not shown) that links the host operating system 16 and the configurable IC die 1340. Drivers 1320, 1325*a*, and 1330*a* may reside in ring 0 or ring 3 of the operating system. The hardware management component 80 and circuit device 65*a* are assigned to the drivers of the operating system.

The host includes a guest operating system 1316. The guest operating system 1316 includes a device driver 1325*b* for circuit device 65*a*. Device driver 1325*b* may link to the virtual function for the physical function of circuit device 65*a* and link to the registers for the virtual function. The guest operating system 1316 includes a device driver 1325*n* for circuit device 65*n*. The device driver may link to the physical function for circuit device 65*n* and link to the registers for this physical function. The guest operating system includes PCIe drivers 1330*b* and 1330*n* that link respectively to the drivers for circuit device 65*a* and circuit device 65*n* and link to the virtual and physical function for these circuit devices.

An MMU 1362 may be between the operating system and the configurable IC die and manage the virtual memory for the operating system and configurable IC die. The MMU may also be positioned between the guest operating system and the configurable IC die and manage the virtual memory for the guest operating system and configurable IC die.

The physical function for the nth circuit device 65*n* operating on the configurable IC die is assigned to guest operating system 1316 as a PCIe passthrough circuit device to the guest operating system. The virtual function for the circuit device 65*a* operating on the configurable IC die is assigned to guest operating system 1316 as a PCIe passthrough circuit device to the guest operating system. The operating system and configurable IC die are configured for SR-IOv functionality on the physical function for circuit device 65*a* where this circuit device may be a NIC.

Also, the operating system, guest operating system, and configurable IC die may operate as described above where the operating system and the guest operating adapt to the changing PCIe identities of changing circuit devices operating on the configurable IC die. That is, the PCIe drivers of the operating system and the guest operating system may enumerate and re-enumerate the PCIe physical functions of the PCIe devices (e.g., circuit devices 65*a* . . . 65*n*) operating on the configurable IC die.

The PCIe drivers 1330*a* . . . 1330*n* may be initialized and configured for the discovered PCIe devices. Thereafter, device functionality for the device drivers for the circuit devices may be initialized and configured. If the one of the circuit devices 65*a* is configured for operation on the configurable IC die, then the operating system may discover this device during enumeration or re-enumeration, and the guest operating system may not discover the nth circuit device 65*n* if the nth circuit device is not configured to operate. Alternatively, if the circuit devices 65*a* are not configured for operation on the configurable IC die, then the operating system may not discover this device during enumeration or re-enumeration, and the guest operating system may discover the nth circuit device 65*n* if the nth circuit device is configured to operate.

Figure 14:
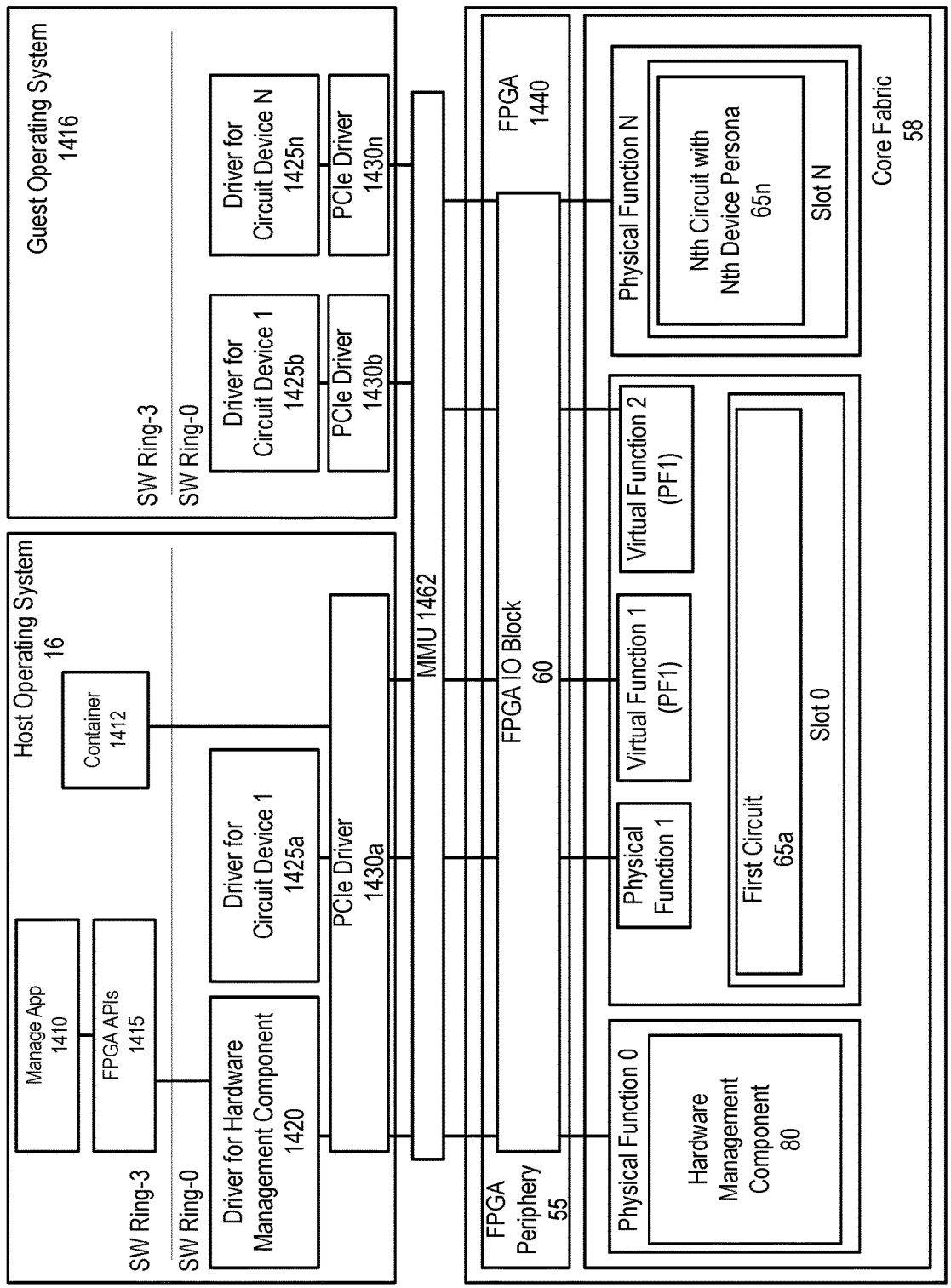
FIG. 14 illustrates elements of a host operating system and communication links that link elements of the host operating system to elements of a configurable IC die, in another embodiment.

FIG. 14 illustrates elements of host operating system 16 and communication links 1400 that link elements of the host operating system to elements of configurable IC die 1440, in an embodiment. Also illustrated is a guest operating system

1416 where communication links 1400 link elements of the guest operating system to elements of the configurable IC die. The configurable IC die may be an FPGA.

Configurable IC die 1440 may be the same or similar to any one of the configurable IC dies described above. The configurable IC die may include any of the elements of any of the configurable IC dies described above in any combination, such as a number of circuit devices 65*a* . . . 65*n* (e.g., a NIC, an NVMe, or other devices).

The host operating system includes a management application 1410 and configurable IC die APIs 1415. The management application and configurable IC die APIs may reside in software ring 0 or ring 3 of the operating system. The host operating system also includes a driver 1420 for hardware management component physical function 80. The host operating system includes a device driver 1425*a* for circuit device 65*a*. Device driver 1425*a* for circuit device 65*a* may link to the physical functions and registers for this circuit device.

The host operating system includes a PCIe driver 1430*a* for a PCIe bus (not shown) and PCIe functions linking host operating system 16 and configurable IC die 1440. Drivers 1420, 1425*a*, and 1430*a* may reside in software ring 0 or ring 3 of the operating system. The hardware management component 80 and circuit device 65*a* are assigned to the drivers of the operating system.

The host includes a guest operating system 1416. The guest operating system 1416 that includes a driver 1425*b* for circuit device 65*a*. The driver may link to the virtual function for the physical function of circuit device 65*a* and link to the registers for the virtual function. The guest operating system 1416 includes a driver 1425*n* for circuit device 65*n*. The driver may link to the physical function for circuit device 65*n* and link to the registers for this physical function. The guest operating system includes PCIe drivers 1430*b* and 1430*n* that link respectively to the drivers for circuit device 65*a* and circuit device 65*n* and link to the virtual and physical function for these circuit devices.

An MMU 1462 may be between the operating system and the configurable IC die and manages the virtual memory for the operating system and configurable IC die. The MMU may also be positioned between the guest operating system and the configurable IC die and manages the virtual memory for the guest operating system and configurable IC die.

The physical function for the nth circuit device 65*n* operating on the configurable IC die is assigned to guest operating system 1416 as a PCIe passthrough circuit device to the guest operating system.

The virtual function 1 for the circuit device 65*a* is assigned to a container 1412. The virtual function 2 for the circuit device 65*a* is assigned to guest operating system 1416 as a PCIe passthrough circuit device to the guest operating system. The operating system and configurable IC die are configured for SR-IOV functionality on the physical function for circuit device 65*a* where this circuit device may be a NIC.

The operating system, guest operating system, and configurable IC die may operate as described above where the operating system and the guest operating adapt to the changing PCIe identities of changing circuit device operating on the configurable IC die. That is, the PCIe drivers of the operating system and the guest operating system may enumerate and re-enumerate the PCIe physical functions of the PCIe devices (e.g., circuit devices 65*a* . . . 65*n*) operating on the configurable IC die. The PCIe drivers 1430*a* . . . 1430*n* may be initialized and configured for the discovered PCIe devices. Thereafter, device functionality for the drivers for the circuit devices may be initialized and configured. After initialization and configuration, the device functionality may be managed by the drivers for the circuit devices. If the one of the circuit devices 65*a* is configured for operation on the configurable IC die, then the operating system may discover this device during enumeration or re-enumeration, and the guest operating system may not discover the nth circuit device 65*n* if the nth circuit device is not configured to operate. Alternatively, if the circuit devices 65*a* are not configured for operation on the configurable IC die, then the operating system may not discover this device during enumeration or re-enumeration, and the guest operating system may discover the nth circuit device 65*n* if the nth circuit device is configured to operate.

The configuration of the host allows for a number of benefits. For example, the host operating system and the BIOS may be reconfigured to recognize a second circuit device that is enabled for operation after a first circuit device is disabled for operation without shutting down and power back up the host for re-enumerating the PCIe function of the configurable IC die. Also, a relatively large memory is allocated during power-up of the host so that any circuit device operating on the configurable IC die will operate without a memory constraint. The host does not have to be powered down and powered back up to reallocate memory for the second circuit device where the second circuit device has a larger memory requirement than the first circuit device. The flexibility allows for exploiting the multi-circuit device functionality of configurable IC dies, such as FPGAs, while the host remains fully powered up by simulating hot-unplug and hot-plugin events where no hot-unplug or hot-plugin has actually occurred. The existing PCIe functions are repurposed to allow this circuit device switch.

Figure 15:
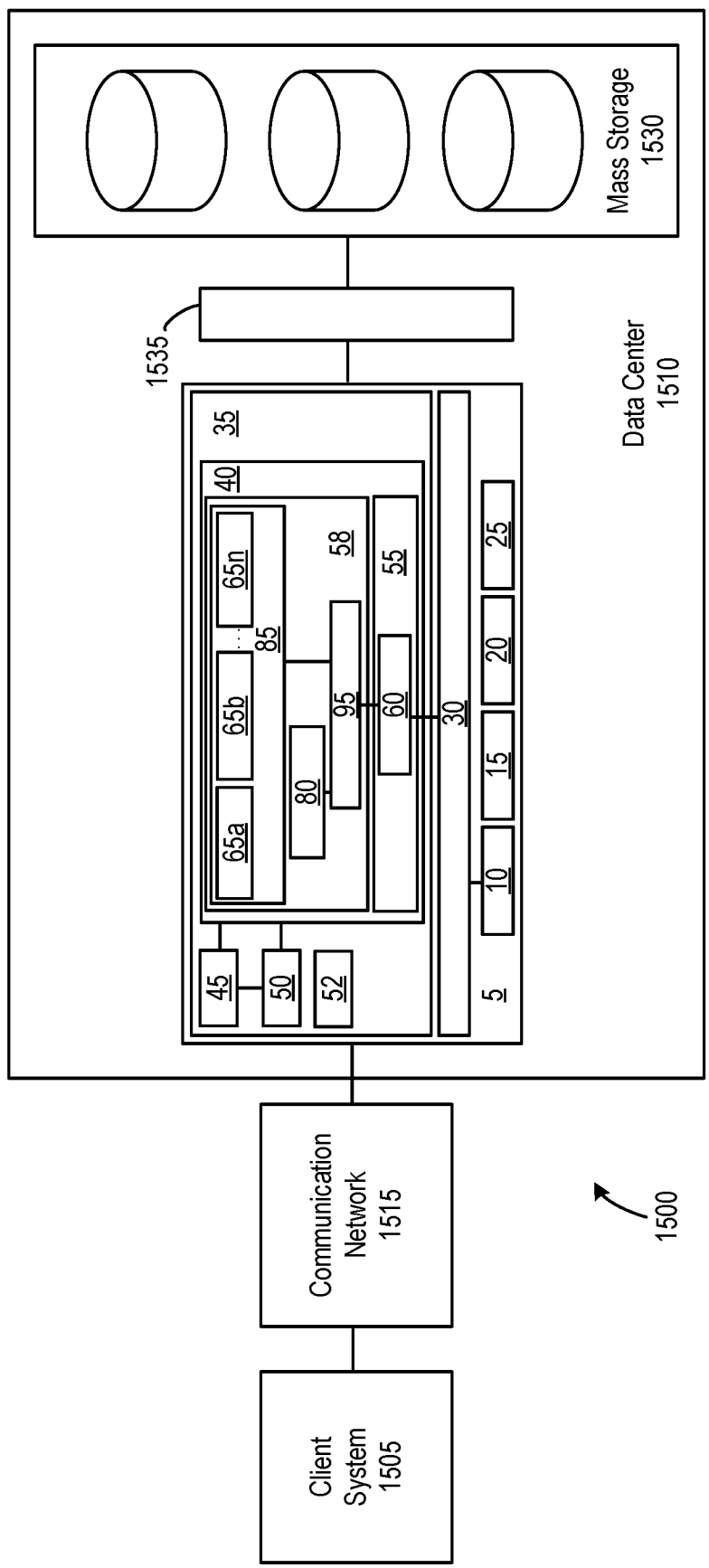
FIG. 15 illustrates a data system, in an embodiment.

FIG. 15 illustrates a data system 1500, in an embodiment. Data system 1500 includes a client system 1505 that is adapted to access a data center 1510 using a communication network 1515. The client system 1505 may include one or more client computers that are adapted to access data stored in the data center. The client computer may include a server, a desktop computer, a laptop computer, a mobile device (e.g., a tablet computer, a smartphone, or other devices), any combination of these devices, or other devices. The client computer may transfer data to the data center for storage in the data center, retrieve data from the data center, or request alteration of data in the data center. Communication network 1515 may include one or more networks, such as the Internet, one or more intranets, or other network systems.

Data center 1510 includes host 5 (i.e., server), mass storage 1530, an IP switch 1535, and may include other elements. While FIG. 15 shows that the data center includes server 5, the data center may include any of the servers described, such as server 205, 305, 405, or 705. Further, a server in the data center may include any of the operating systems, guest operating systems, or both described above and shown in the figures, such as FIGS. 1, 2, 3, 4, 5, 7, 10, 11, 12, and 13. The server in the data center may operate according to any of the methods described and illustrated, such as the methods illustrated in FIGS. 6, 8, 9, and 10.

Mass storage 1530 includes one or more types of memory devices, such as a disk array that includes a number of disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

One or more processing cores 10 of the server may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

The server may be an aggregated server or a disaggregated server. Various components of the server may be located on a single sled in a data center rack, distributed among two or more sleds in a data center rack, or are distributed among a number of sleds in a number of data center racks. Distributing components of a server among sleds, data center racks, or both may facilitate relatively fast communication between the components by positioning select components in frequent communication relatively close to each other. For example, in a server where the processor accesses the memory subsystem more frequency than the configurable IC die (e.g., FPGA), the processor and memory subsystem may be located relatively close (e.g., on a first sled) in a data center rack and the configurable IC die may be located farther from the memory subsystem (e.g., on a different second sled) in the data center rack. Alternatively, the second sled may be positioned nearer the mass storage than the first sled, for example, if the configurable IC die accesses the mass storage with a higher frequency than the processor.

Figure 16:
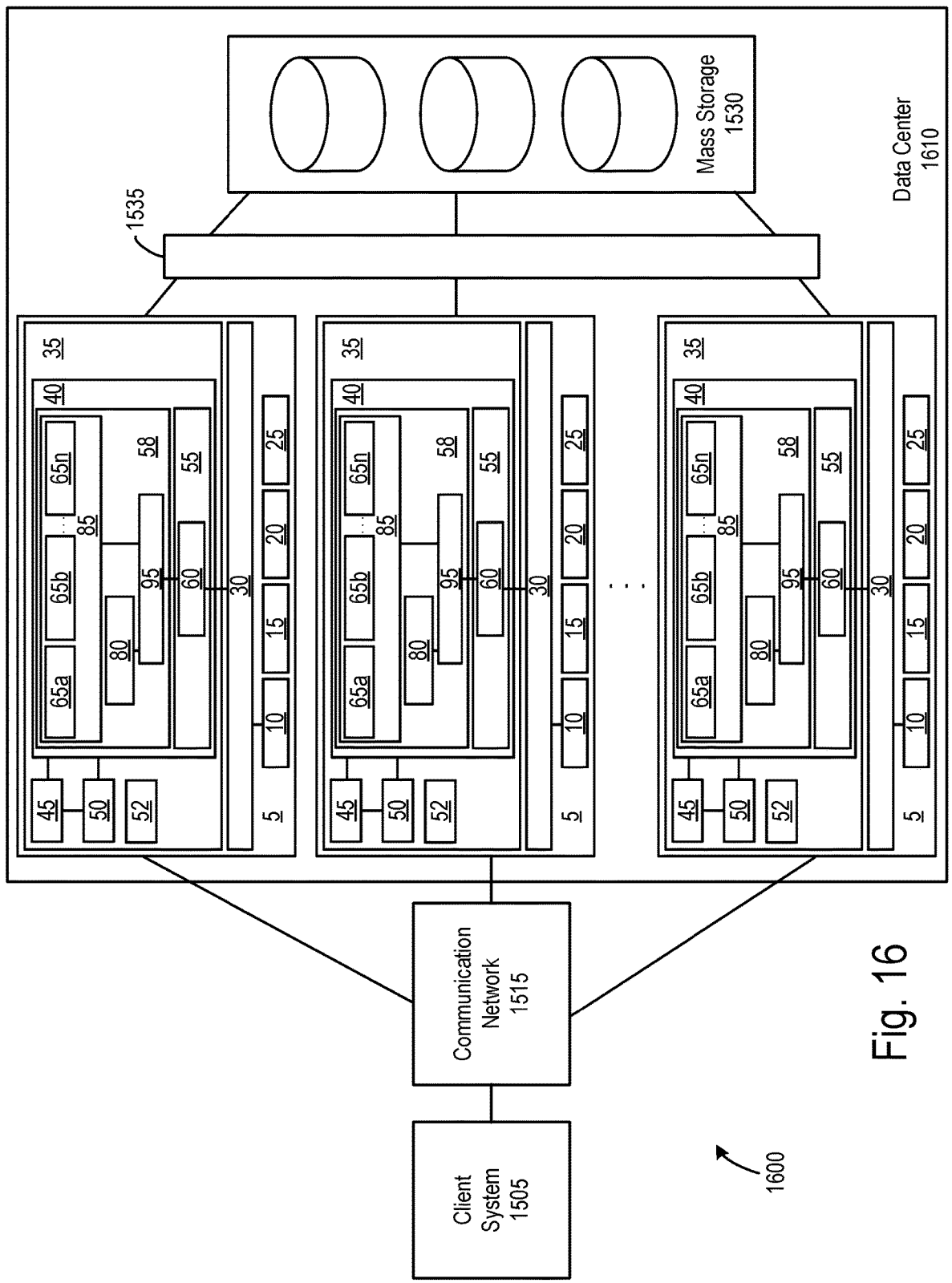
FIG. 16 illustrates a data system, in another embodiment.

FIG. 16 illustrates a data system 1600, in an embodiment. Data system 1600 is similar to data center 1500, but includes a data center 1610 that includes a number of hosts 5 (i.e., servers). While FIG. 16 shows that the data center includes servers 5, the data center may include any of the servers described, such as servers 205, 305, 405, or 705. Further, a server in the data center may include any of the operating systems, guest operating systems, or both described above and shown in the figures, such as FIGS. 1, 2, 3, 4, 5, 7, 10, 11, 12, and 13. The server in the data center may operate according to any of the methods described and illustrated, such as the methods illustrated in FIGS. 6, 8, 9, and 10.

In an embodiment, a semiconductor device includes a core fabric. The core fabric is configurable to include a reconfigurable partial reconfiguration (PR) slot comprising a first physical function a first circuit device assigned to the reconfigurable PR slot and having a first device persona. The core fabric is configurable to include a second circuit device assigned to the reconfigurable PR slot and having a second device persona. The first and second circuit devices are different circuit devices and the first and second device personas are different device personas. The core fabric is configurable to include a hardware management component. The hardware management component is adapted to: reconfigure the first physical function to expose the second device persona rather than expose the first device persona; trigger a host re-enumeration component to request a host operating system of a host to re-enumerate the first physical function to discover the second persona and replace the first device persona in the host operating system with the second device persona; disable the first circuit device from operating with the host operating system; and enable the second circuit device for operating with the host operating system.

The hardware management component may include a second physical function that is adapted to reconfigure the first physical function to expose the second device persona for the re-enumeration rather than expose the first device persona for the re-enumeration.

The semiconductor device may include a periphery that includes a hardened input-output block. The core fabric includes a hard PCIe endpoint block coupled between the hardware management component and the input-output block and coupled between the reconfigurable PR slot and the input-output block.

The core fabric may include the host re-enumeration component, which is a hot-plug capable soft switch. A host operating system may include the host re-enumeration component, which is a hot-plug-emulation component of the host operating system. The host re-enumeration component may be a hot-plug capable discrete switch.

The hardware management component may be configured to request the host re-enumeration component to trigger removal of a first driver for the first circuit device from the host operating system.

The hardware management component may be configured to request the host re-enumeration component to trigger installation, loading, or both of a second driver in the host operating system and the second driver is a driver for the second circuit device.

The core fabric is configurable to comprise a third circuit device having a third device persona, a second reconfigurable PR slot comprising a second physical function, and the third circuit device is assigned to the second reconfigurable PR slot and the second physical function.

Figure 17:
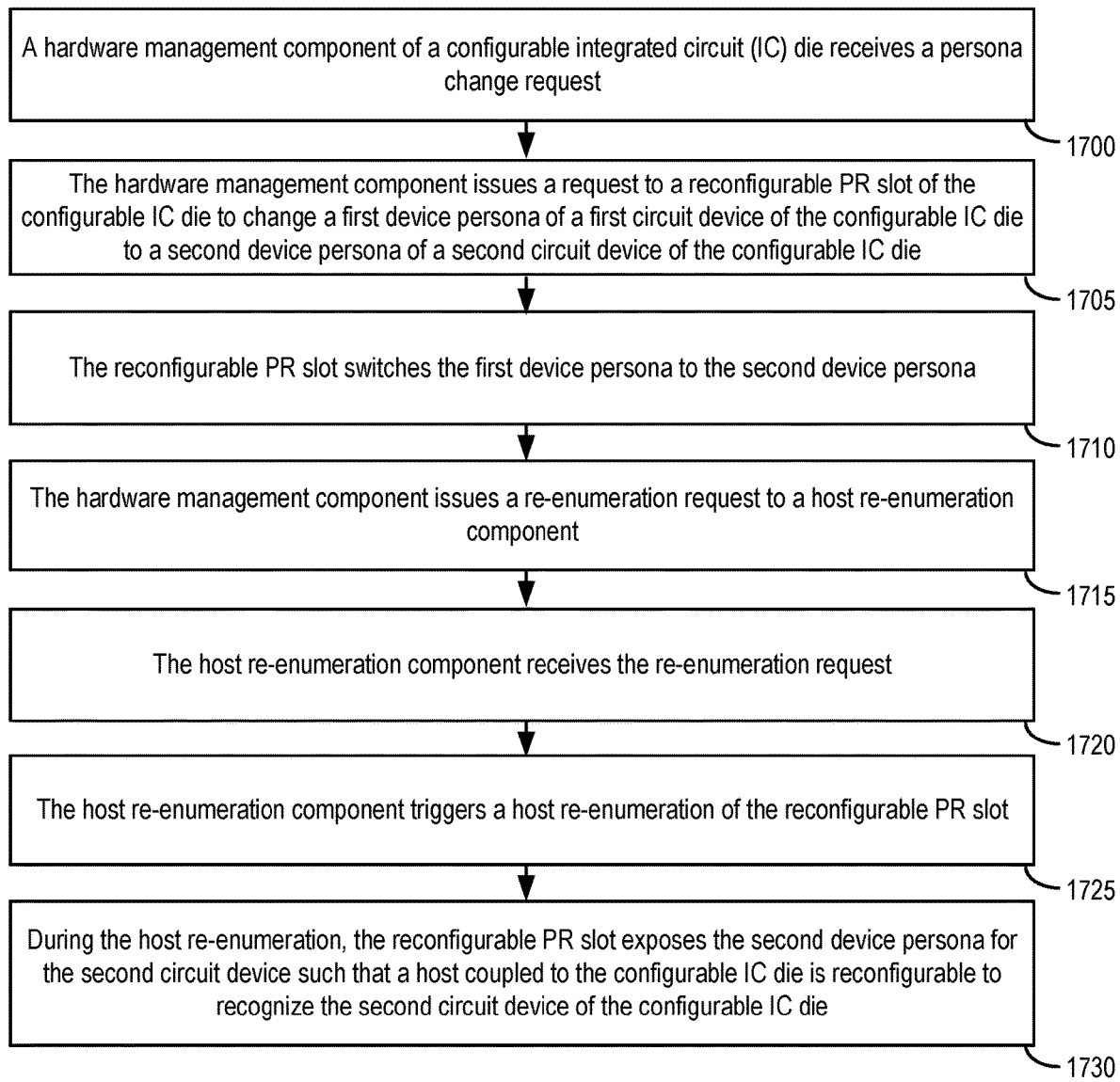
FIG. 17 is a flow diagram of a method of operation of a configurable IC die, in an embodiment.

FIG. 17 is a flow diagram of a method of operation of a configurable IC die, in an embodiment. The flow diagram represents one example embodiment. Steps may be added to, removed from, or combined in the flow diagram without deviating from the scope of the embodiment.

At 1700, a hardware management component of a configurable integrated circuit (IC) die receives a persona change request.

At 1705, the hardware management component issues a request to a reconfigurable partial reconfiguration (PR) slot of the configurable IC die to change a first device persona of a first circuit device of the configurable IC die to a second device persona of a second circuit device of the configurable IC die. The hardware management component, the reconfigurable PR slot, and the first and second circuit devices are configured in a core fabric of the configurable IC die.

At 1710, the reconfigurable PR slot switches the first device persona to the second device persona.

At 1715, the hardware management component issues a re-enumeration request to a host re-enumeration component.

At 1720, the host re-enumeration component receives the re-enumeration request.

At 1725, the host re-enumeration component triggers a host re-enumeration of the reconfigurable PR slot.

At 1730, during the host re-enumeration, the reconfigurable PR slot exposes the second device persona for the second circuit device such that a host coupled to the configurable IC die is reconfigurable to recognize the second circuit device of the configurable IC die.

The method may further include, during the host re-enumeration, not exposing the first device persona for the first circuit device by the reconfigurable PR slot, such that the host will not recognize the first circuit device of the configurable IC die.

The re-enumeration component may be a hot-plug capable soft switch, which is configured in the core fabric of the configurable IC die.

The re-enumeration component may be a hot-plug-emulation component of a host operating system of the host.

The method may further include requesting by the hardware management component removal of an installed device driver for the first circuit device from a host operating system of the host.

The method may further include requesting by the hardware management component loading, installation, or both of a device driver by the host for the second circuit device.

The switching by the reconfigurable PR slot the first device persona to the second device persona may include a first physical function of the hardware management component controlling the reconfigurable PR slot to reconfigure a second physical function of the reconfigurable PR slot to expose the second device persona and not expose the first device persona.

Figure 18:
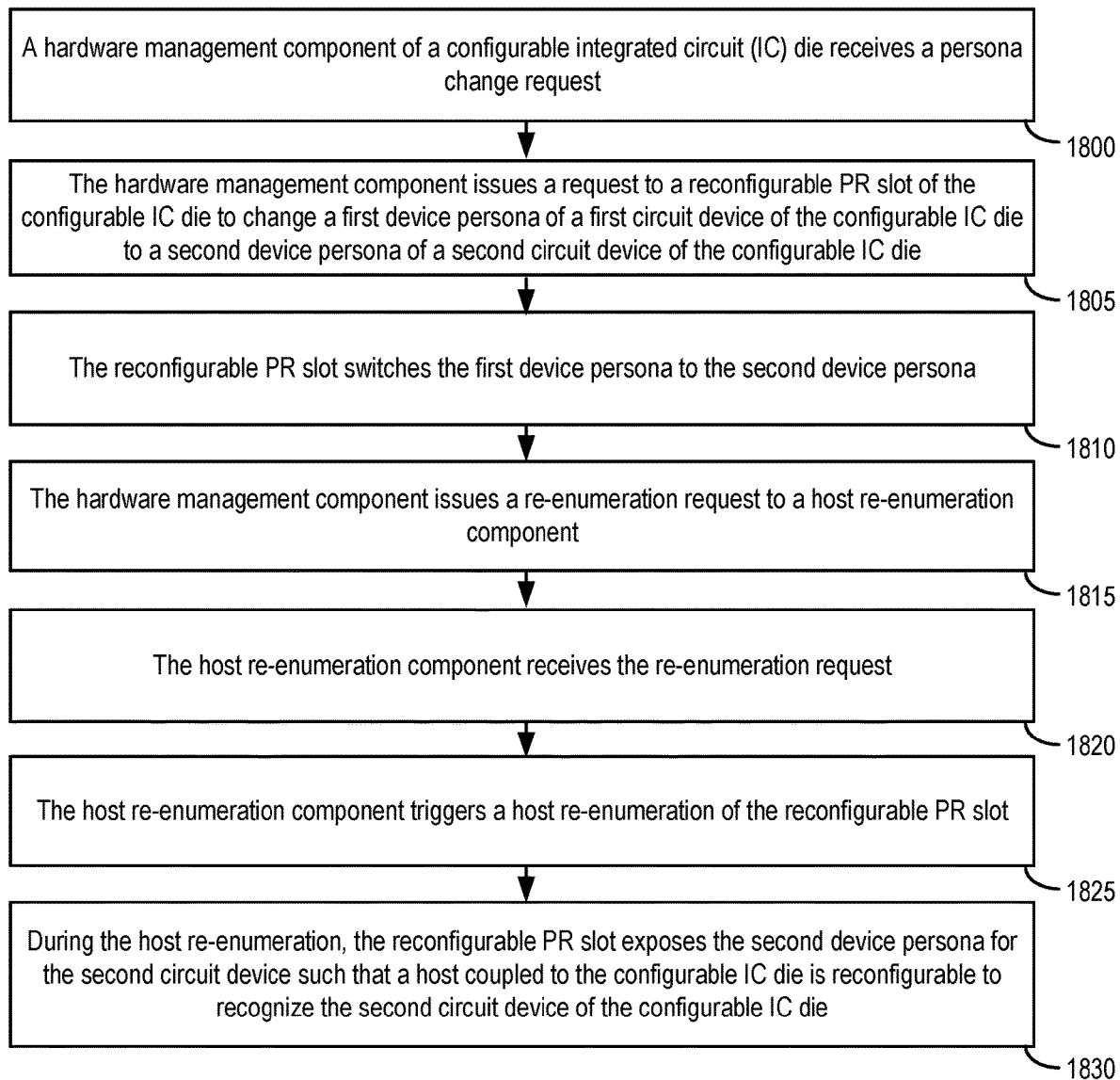
FIG. 18 is a flow diagram of a method of operation a system, in an embodiment.

FIG. 18 is a flow diagram of a method of operation, in an embodiment. The flow diagram represents one example embodiment. Steps may be added to, removed from, or combined in the flow diagram without deviating from the scope of the embodiment.

At 1800, a peripheral card is configured to power on when a host that the peripheral card is installed in is powered on and booted. The peripheral card includes a configurable IC die that is mounted on the peripheral card. The configurable IC die includes a first circuit device and a second circuit device in a core fabric of the configurable IC die.

At 1805, during a first enumeration by the host, a physical function of a resource reservation component is allowed to expose a first resource amount requirement of the first circuit device to a host and a physical function of a reconfigurable PR slot is allowed to expose a second resource amount requirement to the host. The second resource amount requirement is zero. In an embodiment, the second resource amount is a minimal amount, such as an amount that me be for approximately an address range for about one system page.

At 1810, during the first enumeration by the host, a physical function of a hardware management component is allowed to expose a third resource amount requirement to the host.

At 1815, the host operating system is configured to reserve a quantity of host resources for the configurable IC die using the first, second, and third resource amount requirements. During the first enumeration by the host, the host may receive the first resource amount requirement, the second resource amount requirement, and the third resource amount requirement.

At 1820, during a second enumeration by the host, the physical function of the resource reservation component is allowed to expose a fourth resource amount requirement to the host, the physical function of the reconfigurable PR slot is allowed to expose a fifth resource amount requirement to the host, and the physical function of a hardware management component is allowed to expose a sixth resource amount requirement to the host. A first cumulative resource amount requirement of the first and second resource amount requirements is equal to a second cumulative resource amount requirement of the fourth and fifth resource amount requirements.

At 1825, the host operating system is configured to allocate a first portion of the quantity of host resources to the resource reservation component based on the fourth resource amount requirement and to allocate a second portion of the amount of host resources to the reconfigurable PR slot for the second circuit device based on the fifth resource amount. During the second enumeration by the host, the host may receive the fourth, fifth, and sixth resource amount requirements.

The method may further include allowing, during a third enumeration by the host, the physical function of the resource reservation component to expose a seventh resource amount requirement to the host, the physical function of the reconfigurable PR slot to expose an eighth resource amount requirement to the host, and the physical function of the hardware management component to expose a ninth resource amount requirement to the host. During the third enumeration by the host, the host may receive the seventh and eighth resource amount requirements. A third cumulative resource amount requirement of the seventh and eighth resource amount requirements is equal to the second cumulative resource amount requirement of the fourth and fifth resource amount requirement.

The method may further include allowing, during a third enumeration by the host, configuring the host operating system to allocate a third portion of the quantity of host resources to the resource reservation component based on the seventh resource amount requirement and to allocate a fourth portion of the amount of host resources to the reconfigurable PR slot for the third circuit device based on the eighth resource amount requirement.

The method may further include configuring the host to not change the amount of the host resources. The first resource amount requirement may be a first address range requirement and the second resource amount requirement may be a second address range requirement.

This description has been presented for the purposes of illustration and description. It is not intended to be exhaustive or to limit the invention to the precise form described, and many modifications and variations are possible in light of the teaching above. For example, while SiP devices have been described above, embodiments described may be applied to a variety of multi-chip modules, multi-die assemblies, system-on-package devices, and other multi-die devices. The implementations were chosen and described in order to best explain the principles of the embodiments and their practical applications. This description will enable others skilled in the art to best utilize and practice the invention in various implementations and with various modifications as are suited to a particular use. The scope of the invention is defined by the following claims.

The invention claimed is:

1. A semiconductor device comprising:
   a core fabric configurable to comprise:
   a reconfigurable partial reconfiguration (PR) slot comprising a first physical function;
   a first circuit device assigned to the reconfigurable PR slot and having a first device persona;
   a second circuit device assigned to the reconfigurable PR slot and having a second device persona, wherein the first and second circuit devices are different circuit devices and the first and second device personas are different device personas; and
   a hardware management component to reconfigure the first physical function to expose the second device persona rather than expose the first device persona, trigger a host re-enumeration component to request a host operating system of a host to re-enumerate the first physical function to discover the second device persona and replace the first device persona in the host operating system with the second device persona, disable the first circuit device from operating with the host operating system, and enable the second circuit device for operating with the host operating system.

2. The semiconductor device of claim 1 wherein the hardware management component comprises a second physical function to reconfigure the first physical function to expose the second device persona for the re-enumeration rather than expose the first device persona for the re-enumeration.

3. The semiconductor device of claim 2 comprising a periphery that includes a hardened input-output block, wherein the core fabric comprises a hard endpoint block coupled between the hardware management component and the input-output block and coupled between the reconfigurable PR slot and the input-output block.

4. The semiconductor device of claim 1 wherein the core fabric comprises the host re-enumeration component, which is a hot-plug capable soft switch.

5. The semiconductor device of claim 1 wherein the host operating system comprises the host re-enumeration component, which is a hot-plug-emulation component of the host operating system.

6. The semiconductor device of claim 1 wherein the host re-enumeration component is a hot-plug capable discrete switch.

7. The semiconductor device of claim 1 wherein the hardware management component is configured to request the host re-enumeration component to trigger removal of a driver for the first circuit device from the host operating system.

8. The semiconductor device of claim 1 wherein the hardware management component is configured to request the host re-enumeration component to trigger installation, loading, or both of a driver in the host operating system, and the driver is for the second circuit device.

9. The semiconductor device of claim 1 wherein the core fabric is configurable to comprise a third circuit device having a third device persona, a second reconfigurable PR slot comprising a second physical function, and the third circuit device is assigned to the second reconfigurable PR slot and the second physical function.

10. A method comprising:
receiving at a hardware management component of a configurable integrated circuit (IC) die a persona change request;
issuing a request by the hardware management component to a reconfigurable partial reconfiguration (PR) slot of the configurable IC die to change a first device persona of a first circuit device of the configurable IC die to a second device persona of a second circuit device of the configurable IC die, wherein the hardware management component, the reconfigurable PR slot, and the first and second circuit devices are configured in a core fabric of the configurable IC die;
switching by the reconfigurable PR slot the first device persona to the second device persona;
issuing a re-enumeration request by the hardware management component to a host re-enumeration component;
receiving the re-enumeration request by the host re-enumeration component;
triggering by the host re-enumeration component a host re-enumeration of the reconfigurable PR slot; and
during the host re-enumeration, exposing the second device persona for the second circuit device by the reconfigurable PR slot, such that a host coupled to the configurable IC die is reconfigurable to recognize the second circuit device of the configurable IC die.

11. The method of claim 10 further comprising during the host re-enumeration, not exposing the first device persona for the first circuit device by the reconfigurable PR slot, such that the host will not recognize the first circuit device of the configurable IC die.

12. The method of claim 10 wherein the host re-enumeration component is a hot-plug capable soft switch, which is configured in the core fabric of the configurable IC die.

13. The method of claim 10 wherein the host re-enumeration component is a hot-plug-emulation component of a host operating system of the host.

14. The method of claim 10 further comprising requesting by the hardware management component removal of an installed device driver for the first circuit device from a host operating system of the host.

15. The method of claim 10 further comprising requesting by the hardware management component loading, installation, or both of a device driver by the host for the second circuit device.

16. The method of claim 10 wherein switching by the reconfigurable PR slot the first device persona to the second device persona comprises a first physical function of the hardware management component controlling the reconfigurable PR slot to reconfigure a second physical function of the reconfigurable PR slot to expose the second device persona and not expose the first device persona.

17. A method comprising:
causing a peripheral card to power on when a host that the peripheral card is installed in is powered on and booted, wherein the peripheral card comprises a configurable IC die mounted on the peripheral card and the configurable IC die comprises a first circuit device and a second circuit device in a core fabric of the configurable IC die;
allowing, during a first enumeration by the host, a physical function of a resource reservation component to expose a first resource amount requirement of the first circuit device to the host, a physical function of a reconfigurable PR slot to expose a second resource amount requirement to the host, wherein the second resource amount requirement is zero, and a physical function of a hardware management component to expose a third resource amount requirement to the host;
allowing, during the first enumeration by the host, for the host to receive the first resource amount requirement, the second resource amount requirement, and the third resource amount requirement;
configuring a host operating system to reserve a quantity of host resources for the configurable IC die using the first, second, and third resource amount requirements;
allowing, during a second enumeration by the host, the physical function of the resource reservation component to expose a fourth resource amount requirement to the host, the physical function of the reconfigurable PR slot to expose a fifth resource amount requirement to the host, and the physical function of a hardware management component to expose a sixth resource amount requirement to the host, wherein a first cumulative resource amount requirement of the first and second resource amount requirements is equal to a second cumulative resource amount requirement of the fourth and fifth resource amount requirements;
allowing, during the second enumeration by the host, for the host to receive the fourth resource amount requirement, the fifth resource amount requirement, and the sixth resource amount requirement; and
configuring the host operating system to allocate a first portion of the quantity of host resources to the resource reservation component based on the fourth resource amount requirement and to allocate a second portion of the quantity of host resources to the reconfigurable PR slot for the second circuit device based on the fifth resource amount requirement.

18. The method of claim 17 further comprising:
allowing, during a third enumeration by the host, the physical function of the resource reservation component to expose a seventh resource amount requirement to the host, the physical function of the reconfigurable PR slot to expose an eighth resource amount requirement to the host, and the physical function of the hardware management component to expose a ninth resource amount requirement to the host, wherein a third cumulative resource amount requirement of the seventh and eighth resource amount requirements is equal to the second cumulative resource amount requirement of the fourth and fifth resource amount requirement;

allowing, during the third enumeration by the host, for the host to receive the seventh resource amount requirement and the eighth resource amount requirement; and
configuring the host operating system to allocate a third portion of the quantity of host resources to the resource reservation component based on the seventh resource amount requirement and to allocate a fourth portion of the quantity of host resources to the reconfigurable PR slot for a third circuit device based on the eighth resource amount requirement.

19. The method of claim 17 further comprising configuring the host to not change the quantity of host resources.

20. The method of claim 17 wherein the first resource amount requirement is a first address range requirement and the second resource amount requirement is a second address range requirement.

* * * * *